US010026913B2

United States Patent
Kim et al.

(10) Patent No.: US 10,026,913 B2
(45) Date of Patent: Jul. 17, 2018

(54) QUANTUM DOT ELECTRONIC DEVICE AND QUANTUM DOT TRANSFER PRINTING METHOD

(71) Applicants: Seoul National University R&DB Foundation, Seoul (KR); INSTITUTE FOR BASIC SCIENCE, Daejeon (KR)

(72) Inventors: Daehyeong Kim, Incheon (KR); Taeghwan Hyeon, Seoul (KR); Moonkee Choi, Seoul (KR); Jiwoong Yang, Seoul (KR); Kwanghun Kang, Goyang (KR)

(73) Assignees: SEOUL NATIONAL UNIVERSITY R&DB FOUNDATION, Seoul (KR); INSTITUTE FOR BASIC SCIENCE, Daejeon (KR)

( * ) Notice: Subject to any disclaimer, the term of this patent is extended or adjusted under 35 U.S.C. 154(b) by 0 days.

(21) Appl. No.: 15/519,453

(22) PCT Filed: Jul. 22, 2015

(86) PCT No.: PCT/KR2015/007618
§ 371 (c)(1),
(2) Date: Apr. 14, 2017

(87) PCT Pub. No.: WO2016/085086
PCT Pub. Date: Jun. 2, 2016

(65) Prior Publication Data
US 2017/0256730 A1    Sep. 7, 2017

(30) Foreign Application Priority Data

Nov. 28, 2014 (KR) .................. 10-2014-0169056
Dec. 2, 2014 (KR) .................. 10-2014-0170841

(51) Int. Cl.
*H01L 51/50* (2006.01)
*C09K 11/88* (2006.01)
(Continued)

(52) U.S. Cl.
CPC .............. *H01L 51/502* (2013.01); *B41F 9/00* (2013.01); *C09D 11/037* (2013.01); *C09D 11/50* (2013.01);
(Continued)

(58) Field of Classification Search
CPC ... H01L 51/52; H01L 51/0097; H01L 51/003; H01L 51/0004; H01L 51/5253; C09K 11/883; B41F 9/00
See application file for complete search history.

(56) References Cited

U.S. PATENT DOCUMENTS 8,007,980 B2    8/2011 Kim
8,846,418 B2    9/2014 Kim et al.
(Continued)

FOREIGN PATENT DOCUMENTS

JP    2009540557 A    11/2009
JP    2012533152 A    12/2012
(Continued)

OTHER PUBLICATIONS

International Search Report for International Patent Application No. PCT/KR2015/007618 filed Jul. 22, 2015.

*Primary Examiner* — Benjamin Sandvik
*Assistant Examiner* — Farid Khan

(57) ABSTRACT

A quantum dot electronic device comprises a first encapsulation layer, a first electrode disposed on the first encapsulation layer, a quantum dot pattern disposed on the first electrode, a second electrode disposed on the quantum dot pattern and a second encapsulation layer disposed on the second electrode. The quantum dot pattern may be formed
(Continued)

by an intaglio transfer printing method, where the method comprises forming a quantum dot layer on a donor substrate, picking up the quantum dot layer using a stamp, putting the quantum dot layer into contact with an intaglio substrate using the stamp and separating the stamp from the intaglio substrate. Using the quantum dot transfer printing method, a subminiature quantum dot pattern can be transferred at a high transfer rate. Accordingly, a highly integrated quantum dot electronic device exhibiting excellent performance and a high integrated quantum dot light emitting device with an ultrathin film can be realized.

18 Claims, 29 Drawing Sheets
(13 of 29 Drawing Sheet(s) Filed in Color)

(51) Int. Cl.
```
C09D 11/50      (2014.01)
C09D 11/037     (2014.01)
B41F 9/00       (2006.01)
H01L 51/52      (2006.01)
H01L 51/56      (2006.01)
H01L 51/00      (2006.01)
B82Y 20/00      (2011.01)
B82Y 40/00      (2011.01)
```
(52) U.S. Cl.
CPC .......... *C09K 11/883* (2013.01); *H01L 51/003* (2013.01); *H01L 51/0004* (2013.01); *H01L 51/0097* (2013.01); *H01L 51/5253* (2013.01); *H01L 51/56* (2013.01); *B82Y 20/00* (2013.01); *B82Y 40/00* (2013.01); *H01L 51/0035* (2013.01); *H01L 51/0037* (2013.01); *H01L 51/0039* (2013.01); *H01L 51/0043* (2013.01); *H01L 51/5056* (2013.01); *H01L 51/5072* (2013.01); *H01L 51/5088* (2013.01); *H01L 51/5092* (2013.01); *H01L 2251/301* (2013.01); *H01L 2251/5338* (2013.01); *H01L 2251/558* (2013.01); *Y10S 977/774* (2013.01); *Y10S 977/824* (2013.01); *Y10S 977/892* (2013.01); *Y10S 977/95* (2013.01)

(56) References Cited

U.S. PATENT DOCUMENTS

| | | | |
|---|---|---|---|
| 2010/0117110 A1* | 5/2010 | Park | B82Y 20/00 257/98 |
| 2011/0132449 A1* | 6/2011 | Ramadas | H05B 33/04 136/256 |
| 2013/0056705 A1* | 3/2013 | Kim | G03F 7/0002 257/13 |
| 2014/0004562 A1* | 1/2014 | Zhong | B82Y 30/00 435/40.5 |
| 2015/0076469 A1* | 3/2015 | Ikemizu | C09K 11/88 257/40 |
| 2015/0236293 A1* | 8/2015 | Lee | H01L 51/524 257/40 |
| 2015/0287927 A1* | 10/2015 | Okubo | B82Y 20/00 257/40 |
| 2015/0303406 A1* | 10/2015 | Kim | H01L 51/5256 257/40 |
| 2015/0368553 A1* | 12/2015 | Nelson | B32B 7/12 428/323 |
| 2016/0004276 A1* | 1/2016 | Stroetmann | G04G 9/007 361/679.03 |
| 2016/0104865 A1* | 4/2016 | Jung | H01L 51/0051 257/40 |
| 2016/0340553 A1* | 11/2016 | Eckert | B32B 27/08 |

FOREIGN PATENT DOCUMENTS

| | | |
|---|---|---|
| JP | 201356412 A | 3/2013 |
| KR | 10-2007-0105536 A | 10/2007 |
| KR | 10-2010-0093858 A | 8/2010 |
| KR | 10-2011-0007166 A | 1/2011 |
| KR | 10-2013-0026874 A | 3/2013 |
| WO | 2007141720 A1 | 12/2007 |
| WO | WO 2009/126115 A1 | 10/2009 |
| WO | 2011005095 A1 | 1/2011 |

* cited by examiner

100

QUANTUM DOT ELECTRONIC DEVICE AND QUANTUM DOT TRANSFER PRINTING METHOD

CROSS-REFERENCE TO RELATED APPLICATIONS

The present specification is a U.S. National Stage of International Patent Application No. PCT/KR2015/007618 filed Jul. 22, 2015, which claims priority to and the benefit of Korean Patent Application Nos. 10-2014-0169056 and 10-2014-0170841 filed in the Korean Intellectual Property Office on Nov. 28, 2014 and Dec. 2, 2014, respectively, the entire contents of which are incorporated herein by reference.

TECHNICAL FIELD

The present invention relates to a quantum dot electronic device and a quantum dot transfer printing method.

BACKGROUND ART

Flexibility and stretchability are an important property in a wearable electronic device, and thus a LED that is transformable and has high resolution is a key element in showing information in the wearable electronic device. In order to develop the transformable LED, a lot of effort has been made recently, but there is a limit in developing an ultrathin film wearable electronic device.

In addition, a research on a light emitting device using a light emitting property of a quantum dot is actively carried out of late. The quantum dot is a semiconductor substance with a few nanometer sizes. There are advantages in the quantum dot that it has high color purity and a self-luminous property, and it is easy to control a color by adjusting its size. As a method of forming an RGB pattern of the quantum dot, technology such as inkjet printing or screen printing has been suggested. However, it is difficult to realize a high integrated wearable light emitting device with an ultrathin film using these technologies.

DISCLOSURE

Technical Problem

In order to solve the above mentioned problems, the present invention provides a high integrated quantum dot electronic device exhibiting excellent performance.

The present invention provides an ultrathin film quantum dot electronic device.

The present invention provides a quantum dot transfer printing method that can improve a transfer rate.

The present invention provides a quantum dot transfer printing method that can realize a high integrated quantum dot electronic device exhibiting excellent performance.

The present invention provides a quantum dot transfer printing method that can realize a quantum dot electronic device with an ultrathin film.

The other objects of the present invention will be clearly understood by reference to the following detailed description and the accompanying drawings.

Technical Solution

A quantum dot electronic device according to an embodiment of the present invention comprises a first encapsulation layer, a first electrode disposed on the first encapsulation layer, a quantum dot pattern disposed on the first electrode, a second electrode disposed on the quantum dot pattern and a second encapsulation layer disposed on the second electrode.

The quantum dot electronic device may comprise a first charge transportation layer disposed between the first electrode and the quantum dot pattern, and a second charge transportation layer disposed between the second electrode and the quantum dot pattern.

A sum of thickness of the first encapsulation layer, the first electrode, the first charge transportation layer, the quantum dot pattern, the second charge transportation layer, the second electrode and the second encapsulation layer may be about 3 µm or less, and a sum of thickness of the first electrode, the first charge transportation layer, the quantum dot pattern, the second charge transportation layer and the second electrode may be about 300 nm or less.

The quantum dot electronic device may be formed by an intaglio transfer printing method that comprises forming a quantum dot layer on a donor substrate, picking up the quantum dot layer using a stamp, putting the quantum dot layer into contact with an intaglio substrate using the stamp and separating the stamp from the intaglio substrate. A surface energy of the intaglio substrate may be greater than a surface energy of the stamp. A transfer rate of the quantum dot pattern by the intaglio transfer printing method may be about 99% or more in a size of about 5 µm×5 µm or more. A size of the quantum dot pattern may be about 20 µm×20 µm or less. The quantum dot pattern may comprise a red quantum dot pattern, a green quantum dot pattern and a blue quantum dot pattern, and the quantum dot electronic device may be a wearable quantum dot light emitting device. The quantum dot pattern is formed of a colloid nanocrystal substance comprising at least one of CdSe/ZnS quantum dot and CdSe/Cds/ZnS quantum dot.

The first encapsulation layer may comprise a first protection layer and a first adhesion layer, the second encapsulation layer may comprise a second protection layer and a second adhesion layer. The first and second protection layers may be formed of poly (p-xylylene), and the first and second adhesion layers may be formed of epoxy resin.

A quantum dot electronic device according to another embodiment of the present invention comprises a substrate and a quantum dot pattern disposed on the substrate, and the quantum dot pattern may be formed by an intaglio transfer printing method that comprises forming a quantum dot layer on a donor substrate, picking up the quantum dot layer using a stamp, putting the quantum dot layer into contact with an intaglio substrate using the stamp and separating the stamp from the intaglio substrate.

A surface energy of the intaglio substrate may be greater than a surface energy of the stamp.

A transfer rate of the quantum dot pattern by the intaglio transfer printing method may be about 99% or more in a size of about 5 µm×5 µm or more. A size of the quantum dot pattern may be about 20 µm×20 µm or less.

The quantum dot pattern may comprise a red quantum dot pattern, a green quantum dot pattern and a blue quantum dot pattern, and the quantum dot electronic device may be a quantum dot light emitting device. The quantum dot pattern may be formed of a colloid nanocrystal substance comprising at least one of CdSe/ZnS quantum dot and CdSe/Cds/ZnS quantum dot.

The substrate may be a wearable substrate, a flexible substrate, a stretchable substrate or a plastic substrate.

A quantum dot transfer printing method according to embodiments of the present invention comprises forming a quantum dot layer on a donor substrate, picking up the quantum dot layer using a stamp, putting the quantum dot layer into contact with an intaglio substrate using the stamp and separating the stamp from the intaglio substrate.

A surface treatment of the donor substrate may be performed before forming the quantum dot layer.

The quantum dot layer may be formed of a colloid nanocrystal substance comprising a quantum dot.

The stamp may be formed of PDMS (polydimethylsiloxane).

A surface energy of the intaglio substrate may be greater than a surface energy of the stamp. The intaglio substrate may be formed of polymer, glass, organic material or oxide.

The intaglio substrate may have a recess area that is concavely formed from its surface to its inside.

When the stamp is separated from the intaglio substrate, a portion being in contact with the intaglio substrate in the quantum dot layer may remain in the intaglio substrate, and a portion corresponding to the recess area may be picked up by the stamp.

A uniform pressure may be put on the quantum dot layer when putting the quantum dot layer into contact with the intaglio substrate using the stamp.

Advantageous Effects

According to a quantum dot transfer printing method according to embodiments of the present invention, a subminiature quantum dot pattern can be transferred at a high transfer rate. Accordingly, a high integrated quantum dot electronic device exhibiting excellent performance can be realized. The quantum dot electronic device can be applied to various electronic devices such as an ultrathin film electronic device, a wearable electronic device, a flexible electronic device, a stretchable electronic device and/or a skin attachment type electronic device, etc. In addition, its application can be expanded to various electronic devices such as a quantum dot light emitting device, an electronic tattoo and the like, and its performance can be enhanced.

Furthermore, by forming the quantum dot pattern through the quantum dot transfer printing method, an ultrathin wearable quantum dot light emitting device with high resolution and an ultrathin skin attachment type flexible (or stretchable) quantum dot light emitting device can be realized. In these quantum dot light emitting device, high resolution pixels having various colors can be formed, and a stable electroluminescence can be maintained under various transformation such as bending, crumpling, wrinkling and the like. A display device with high resolution of 1000 ppi or more can be realized from the wearable quantum dot light emitting device.

DESCRIPTION OF DRAWINGS

The patent or application file contains at least one drawing executed in color. Copies of this patent or patent application publication with color drawing(s) will be provided by the Office upon request and payment of the necessary fee.

BEST MODE

Figure 1:
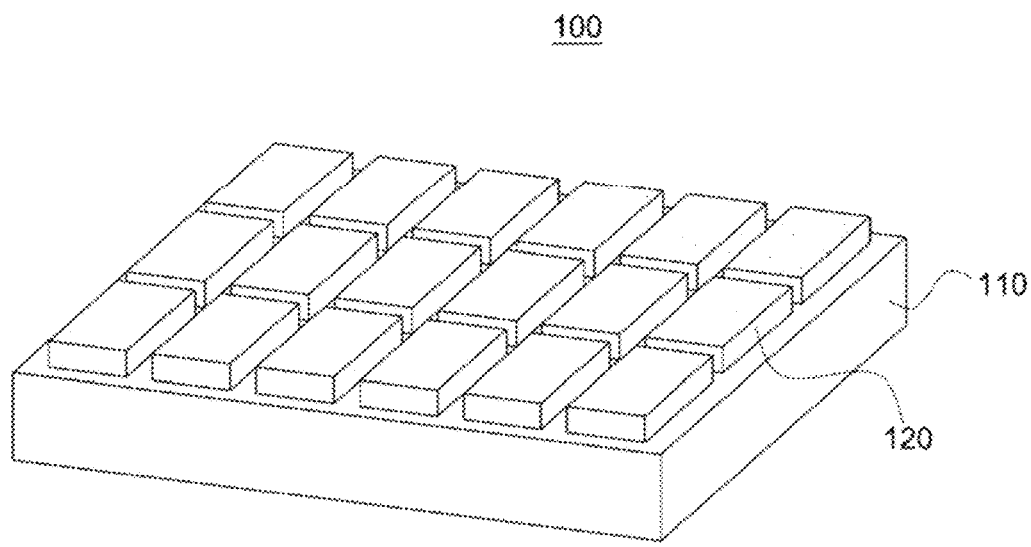
FIG. 1 shows a quantum dot electronic device according to a first embodiment of the present invention.

Hereinafter, a detailed description will be given of the present invention with reference to the following embodiments. The purposes, features, and advantages of the present invention will be easily understood through the following embodiments. The present invention is not limited to such embodiments, but may be modified in other forms. The embodiments to be described below are nothing but the ones provided to bring the disclosure of the present invention to perfection and assist those skilled in the art to completely understand the present invention. Therefore, the following embodiments are not to be construed as limiting the present invention.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section.

Thus, a first element, component, region, layer or section discussed below could be termed a second element, component, region, layer or section without departing from the teachings of the present invention.

It will be understood that when an element is referred to as being "on" another element, it can be directly on the other element or intervening elements may be present therebetween. In contrast, when an element is referred to as being "directly on" another element, there are no intervening elements present.

The size of the element or the relative sizes between elements in the drawings may be shown to be exaggerated for more clear understanding of the present invention. In addition, the shape of the elements shown in the drawings may be somewhat changed by variation of the manufacturing process or the like. Accordingly, the embodiments disclosed herein are not to be limited to the shapes shown in the drawings unless otherwise stated, and it is to be understood to include a certain amount of variation.

FIG. 1 shows a quantum dot electronic device according to a first embodiment of the present invention.

Referring to FIG. 1, a quantum dot electronic device 100 includes a substrate 110 and a quantum dot pattern 120. There is no limit in the kind of the substrate 110, and thus it can be appropriately selected in accordance with the kind of an electronic device. For example, the substrate 110 may be a wearable substrate, a flexible substrate, a stretchable substrate or a plastic substrate.

The quantum dot pattern 120 may be disposed on the substrate 110. The quantum dot pattern 120 may include a quantum dot. For example, the quantum dot may include a CdSe/ZnS quantum dot, a CdSe/CdS/ZnS quantum dot, a Cu—In—Se quantum dot or a PbS quantum dot, but is not restrictive to them. The quantum dot pattern 120 may be formed of a colloid nanocrystal substance including the quantum dot. The quantum dot may have a shell for stability, and have luminescence quantum yield of about 80% or more.

The quantum dot pattern 120 may be formed by an intaglio transfer printing method (see FIGS. 2 to 7). The intaglio transfer printing method enables the quantum dot pattern 120 having a size of 20 μm×20 μm or less to be formed in uniform shape and size, and thus a high integrated electronic device exhibiting excellent performance can be fabricated. The quantum dot electronic device 100 can be applied to various electronic devices including a light emitting device and the like. In particular, the quantum dot electronic device 100 can be easily applied to a wearable electronic device.

FIGS. 2 to 7 are views explaining one example of a method for fabricating the quantum dot electronic device of FIG. 1.

Figure 2:
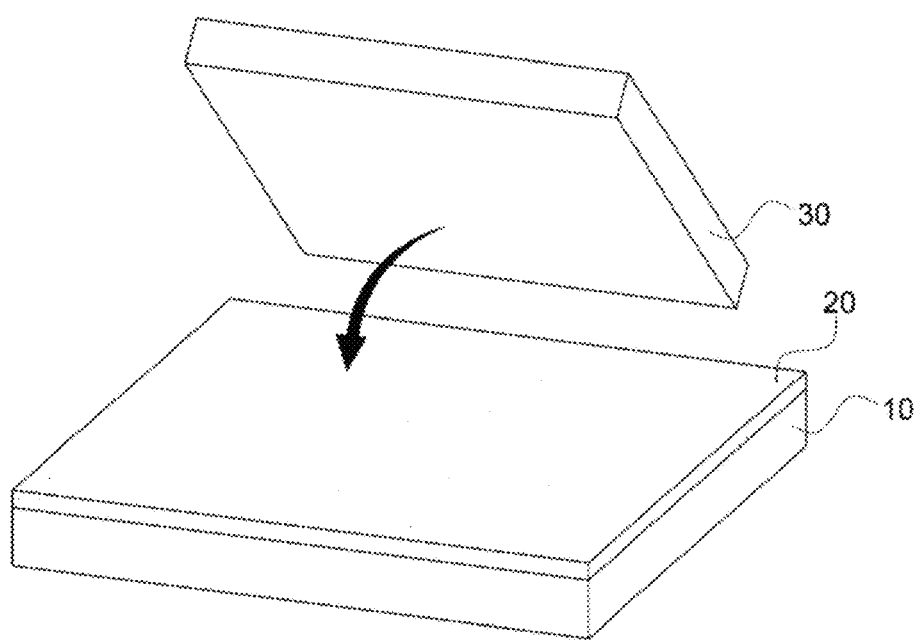
FIGS. 2 to 7 are views explaining one example of a method for fabricating the quantum dot electronic device of FIG. 1.

Referring to FIG. 2, a quantum dot layer 20 is formed on a donor substrate 10. The quantum dot layer 20 may be formed of a colloid nanocrystal substance including a quantum dot. For example, the quantum dot may include a CdSe/ZnS quantum dot, a CdSe/CdS/ZnS quantum dot, a Cu—In—Se quantum dot or a PbS quantum dot, but is not restrictive to them. Before forming the quantum dot layer 20, a surface treatment of the donor substrate 10 may be performed by ODTS (octadecyltrichlorosilane) and the like. The interaction between the donor substrate 10 and the colloid nanocrystal substance is weakened by the surface treatment so that the surface diffusion of the colloid nanocrystal substance actively occurs on the donor substrate 10. As a result, nanoparticles within the colloid nanocrystal substance can agglomerate together to uniformly grow. In addition, the pick-up of the quantum dot layer 20 by the stamp 30 can be done more effectively.

Figure 3:
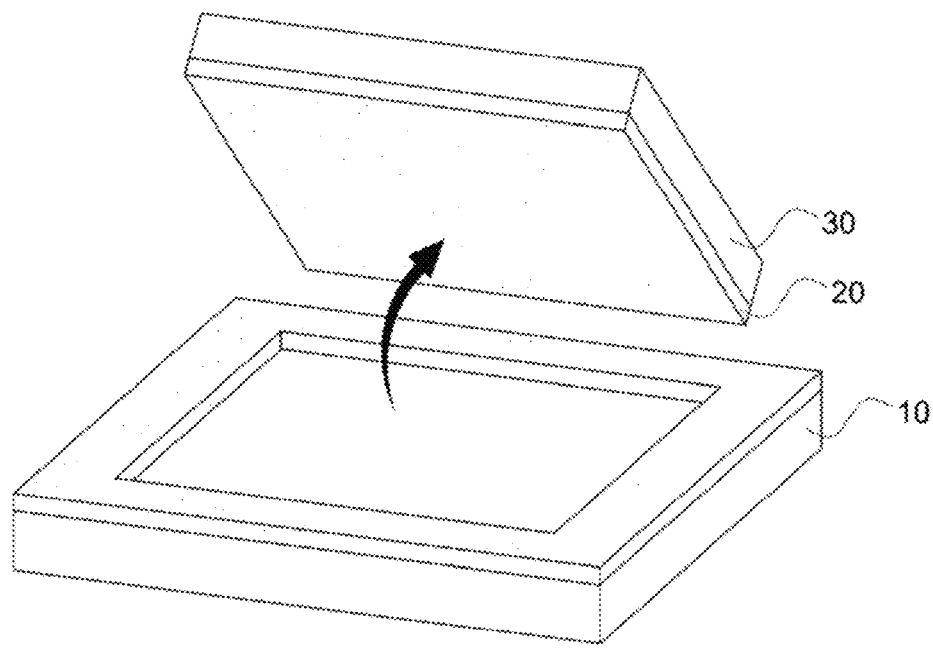

Referring to FIG. 3, the quantum dot layer 20 is separated from the donor substrate 10 by a stamp 30 to be picked up. If the separation is carried out at a rate of 10 cm/s after putting the stamp 30 into contact with the quantum dot layer 20, the quantum dot layer 20 being in contact with the bottom face of the stamp 30 can be separated from the donor substrate 10 to be picked up. For example, the stamp 30 may be formed of PDMS (polydimethylsiloxane).

Materials remaining on the donor substrate 10 can be removed by piranha solution and the like.

Figure 4:
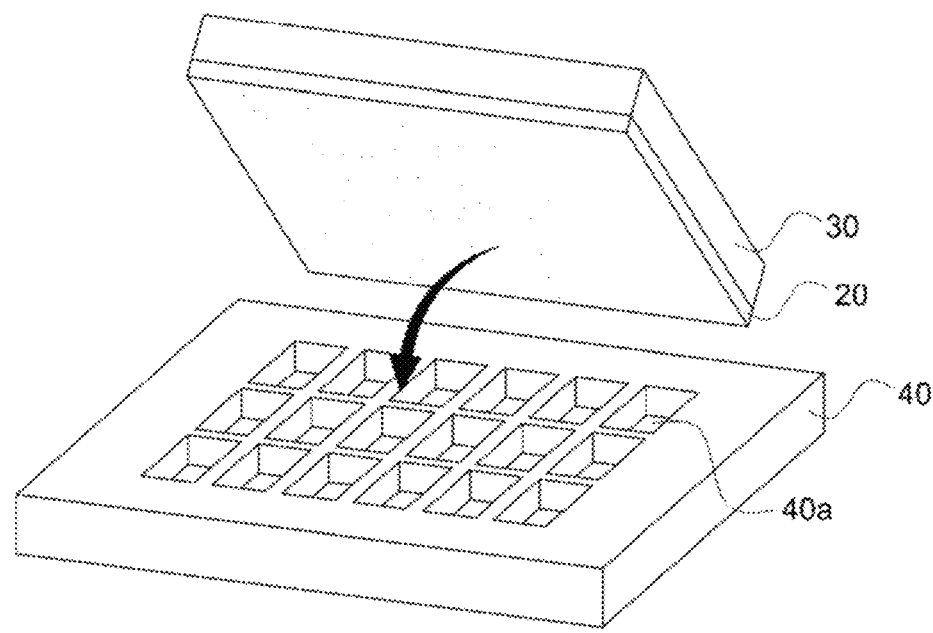

Referring to FIG. 4, the stamp 30 on which the quantum dot layer 20 is formed is disposed and aligned on an intaglio substrate 40. The surface energy of the intaglio substrate 40 is greater than the surface energy of the stamp 30 (In case of the PDMS stamp, its surface energy is 19.8 mJ/m$^2$). For example, the intaglio substrate 40 may be formed of materials meeting the surface energy requirement such as silicone, polymer, glass, organic material, oxide, etc. The intaglio substrate 40 has a recess area 40a that is concavely formed from its surface to its inside.

Figure 5:
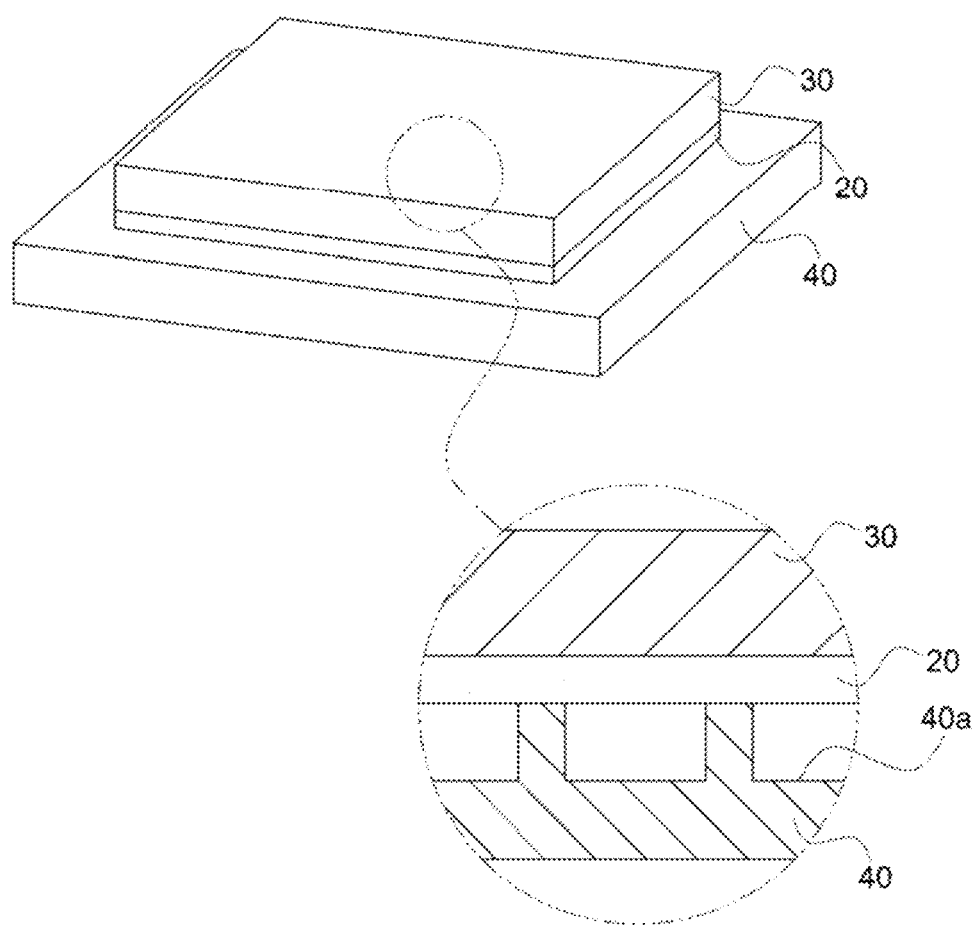

Referring to FIG. 5, the quantum dot layer 20 is put into contact with the intaglio substrate 40. Some pressure may be put on the whole stamp 30 in order that the quantum dot layer 20 is uniformly contact with the intaglio substrate 40. At this time, the quantum dot layer 20 is in contact with the intaglio substrate 40 at a portion other than the recess area 40a. The quantum dot layer 20 is not in contact with the intaglio substrate 40 at a portion corresponding to the recess area 40a.

Figure 6:
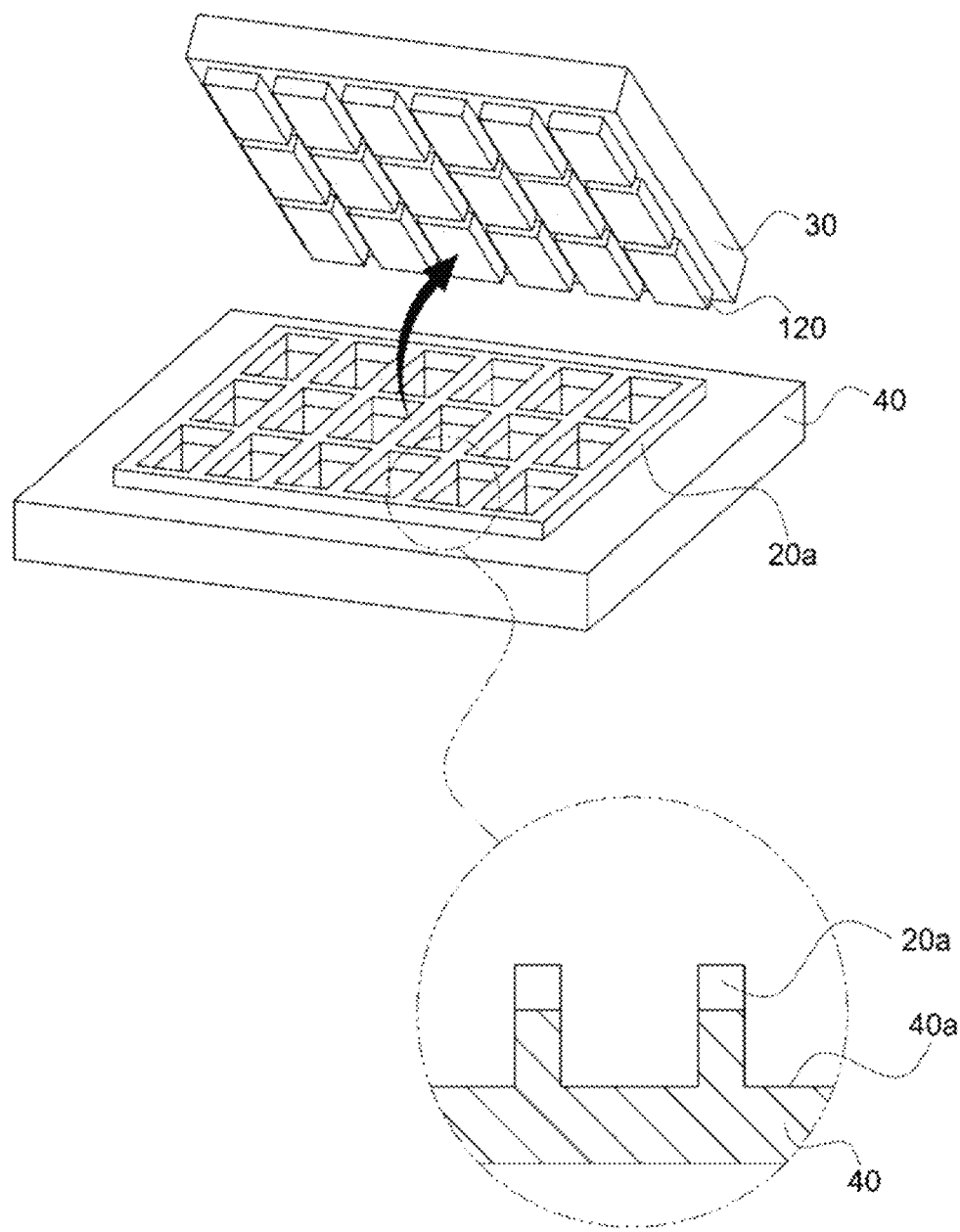

Referring to FIG. 6, the stamp 30 is separated from the intaglio substrate 40. Since the surface energy of the intaglio substrate 40 is greater than that of the stamp 30, the portion 20a of the quantum dot layer being contact with the intaglio substrate 40 is separated from the stamp 30 to remain on the surface of the intaglio substrate 40. Since portion corresponding to the recess area 40a is adhered to the stamp 30, that portion is picked up to form a quantum dot pattern 120. Materials remaining on the intaglio substrate 40 can be removed by piranha solution and the like.

Figure 7:
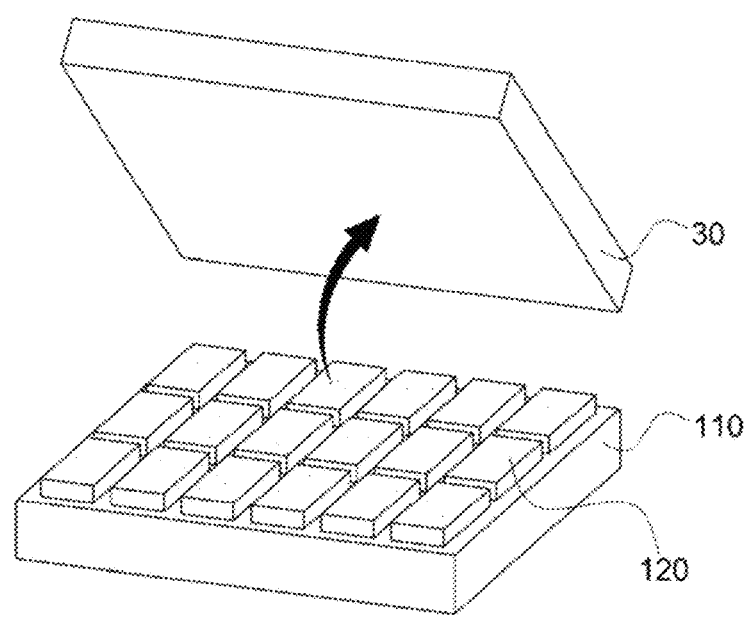

Referring to FIG. 7, the stamp 30 is aligned on a substrate 110, and the quantum dot pattern 120 is transferred to the substrate 110. It is possible to transfer the quantum dot pattern 120 from the stamp 30 to the substrate 110 by putting the stamp 30 with the quantum dot pattern 120 thereon into contact with the substrate 110 and separating the stamp 30 from the substrate 110. The substrate 110 may be a wearable substrate, a flexible substrate, a stretchable substrate or a plastic substrate. It is preferable that a portion being in contact with the quantum dot pattern 120 in the substrate 110 is formed of a substance whose surface energy is greater than the surface energy of the stamp 30.

Figure 8:
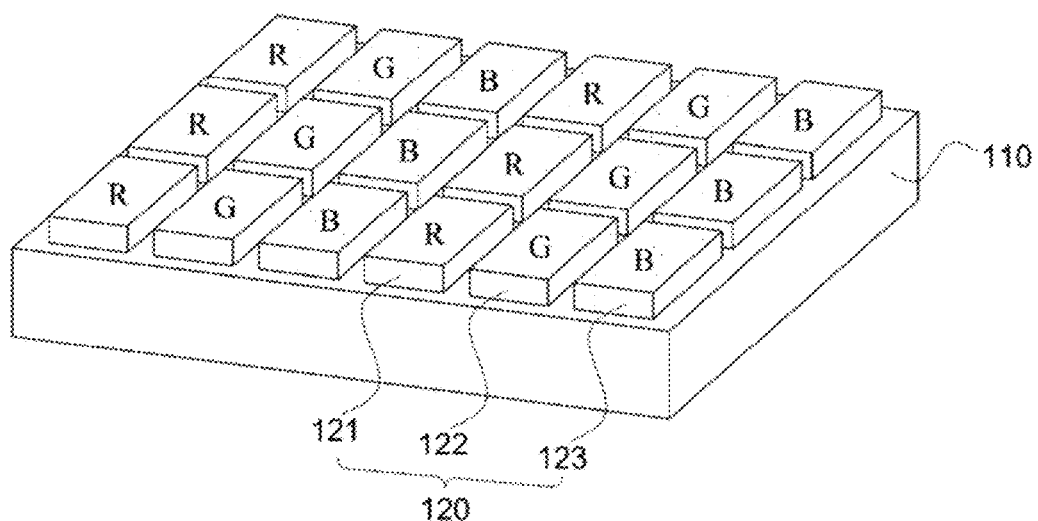
FIG. 8 shows a quantum dot electronic device according to a second embodiment of the present invention.

FIG. 8 shows a quantum dot electronic device according to a second embodiment of the present invention.

Referring to FIG. 8, a quantum dot electronic device 100 includes a substrate 110 and a quantum dot pattern 120. There is no limit in the kind of the substrate 110, and thus it can be appropriately selected in accordance with the kind of an electronic device. For example, the substrate 110 may be a wearable substrate, a flexible substrate, a stretchable substrate or a plastic substrate.

The quantum dot pattern 120 may be disposed on the substrate 110. The quantum dot pattern 120 may include a first quantum dot pattern 121, a second quantum dot pattern 122 and a third quantum dot pattern 123. The quantum dot pattern 120 may include a quantum dot. For example, the first quantum dot pattern 121 may be a red quantum dot pattern including a red quantum dot and be formed of a colloid nanocrystal substance including a CdSe/CdS/ZnS quantum dot and the like. The second quantum dot pattern 122 may be a green quantum dot pattern including a green quantum dot and be formed of a colloid nanocrystal substance including a CdSe/ZnS quantum dot and the like. The third quantum dot pattern 123 may be a blue quantum dot pattern including a blue quantum dot and be formed of a colloid nanocrystal substance including a CdSe/ZnS quantum dot and the like. The quantum dot may have a shell with thickness for stability and have luminescence quantum yield of about 80% or more.

The quantum dot pattern 120 including the first quantum dot pattern 121, the second quantum dot pattern 122 and the third quantum dot pattern 123 may be formed by an intaglio transfer printing method (see FIGS. 8 to 26). The intaglio transfer printing method enables the quantum dot pattern 120 having a size of about 20 μm×20 μm or less to be formed in uniform shape and size, and thus a high integrated electronic device exhibiting excellent performance can be fabricated. The quantum dot electronic device 100 can be applied to various electronic devices including a light emitting device and the like. In particular, the quantum dot electronic device 100 can be easily applied to a wearable electronic device.

FIGS. 9 to 26 are views explaining one example of a method for fabricating the quantum dot electronic device of FIG. 8. The explanation made in the previous embodiment may be omitted.

Figure 9:
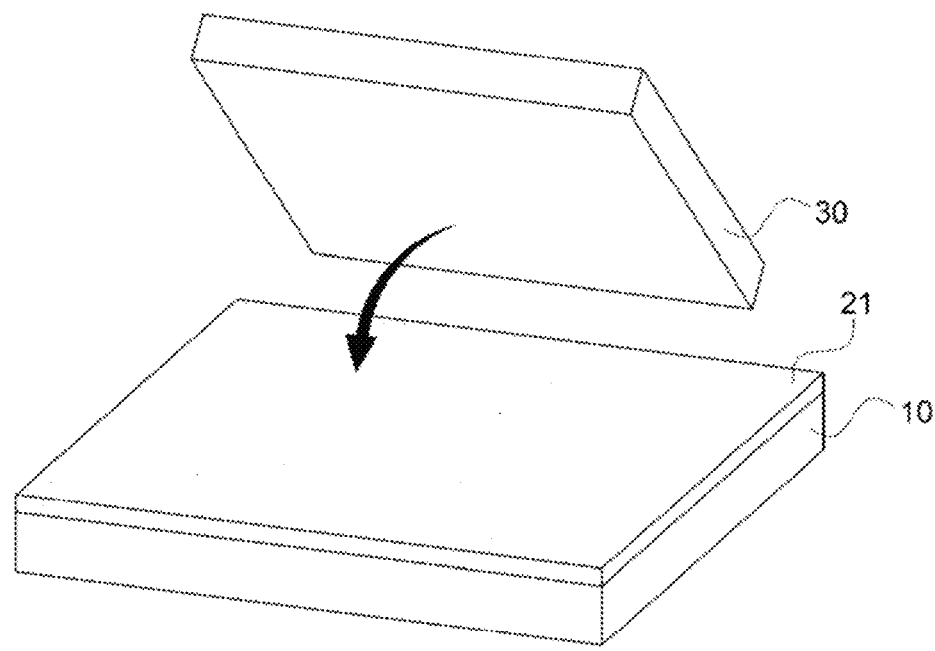
FIGS. 9 to 26 are views explaining one example of a method for fabricating the quantum dot electronic device of FIG. 8.

Referring to FIG. 9, a first quantum dot layer 21 is formed on a donor substrate 10. The first quantum dot layer 21 may be formed of a red quantum dot. For example, the first quantum dot layer 21 may be formed of a colloid nanocrystal substance including a CdSe/CdS/ZnS quantum dot and the like. Before forming the first quantum dot layer 21, a surface treatment of the donor substrate 10 may be performed by ODTS (octadecyltrichlorosilane) and the like.

Figure 10:
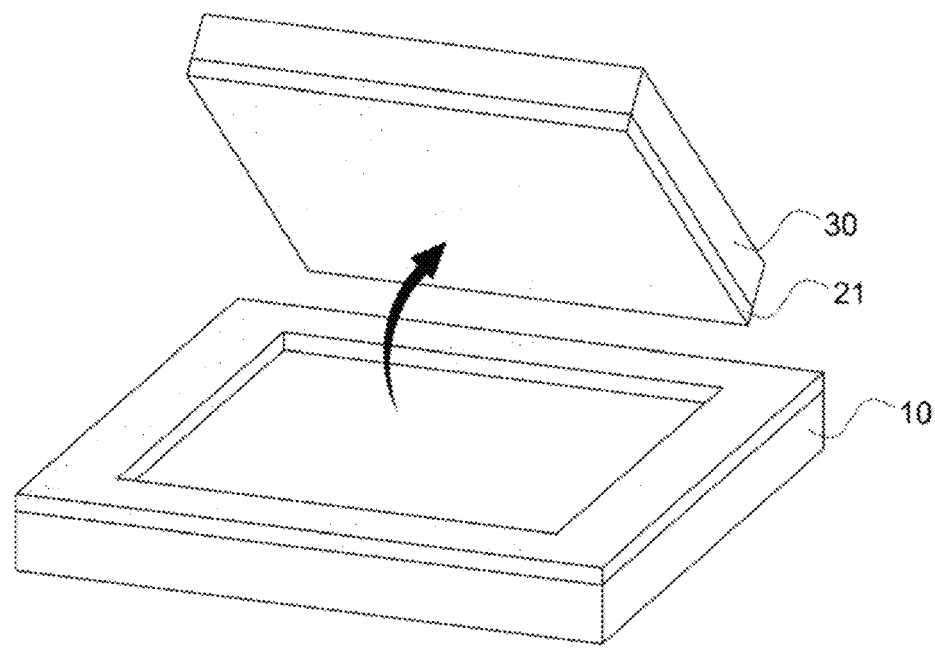

Referring to FIG. 10, the first quantum dot layer 21 is separated from the donor substrate 10 by a stamp 30 to be picked up. If the separation is carried out at a rate of 10 cm/s after putting the stamp 30 into contact with the first quantum dot layer 21, the first quantum dot layer 21 being in contact with the bottom face of the stamp 30 can be separated from the donor substrate 10 to be picked up. For example, the stamp 30 may be formed of PDMS (polydimethylsiloxane).

Figure 11:
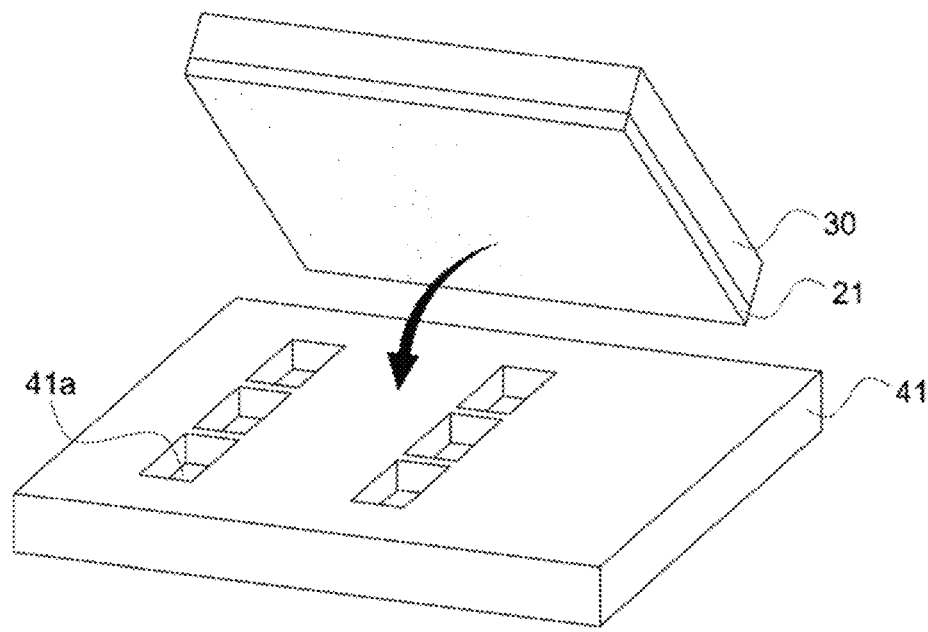

Referring to FIG. 11, the stamp 30 on which the first quantum dot layer 21 is formed is disposed and aligned on a first intaglio substrate 41. The surface energy of the first intaglio substrate 41 is greater than the surface energy of the stamp 30. For example, the first intaglio substrate 41 may be formed of materials meeting the surface energy requirement such as silicone, polymer, glass, organic material, oxide, etc. The first intaglio substrate 41 has a recess area 41a that is concavely formed from its surface to its inside.

Figure 12:
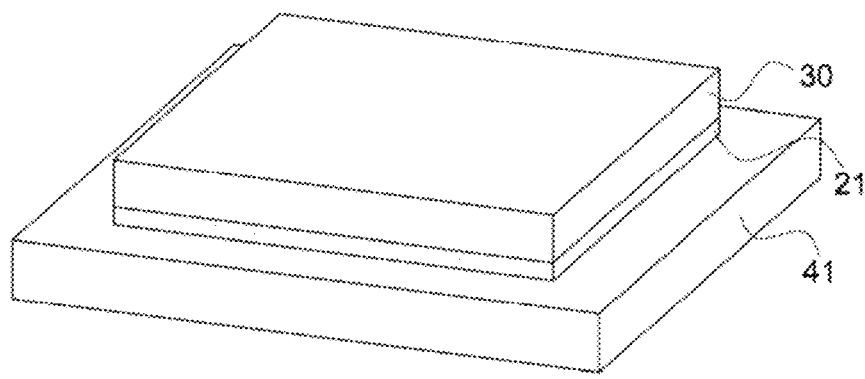

Referring to FIG. 12, the first quantum dot layer 21 is put into contact with the first intaglio substrate 41. Some pressure may be put on the whole stamp 30 in order that the first quantum dot layer 21 keeps uniformly in contact with the first intaglio substrate 41. At this time, the first quantum dot layer 21 is in contact with the first intaglio substrate 41 at a portion other than the recess area 41a. The first quantum dot layer 21 is not in contact with the first intaglio substrate 41 at a portion corresponding to the recess area 41a.

Figure 13:
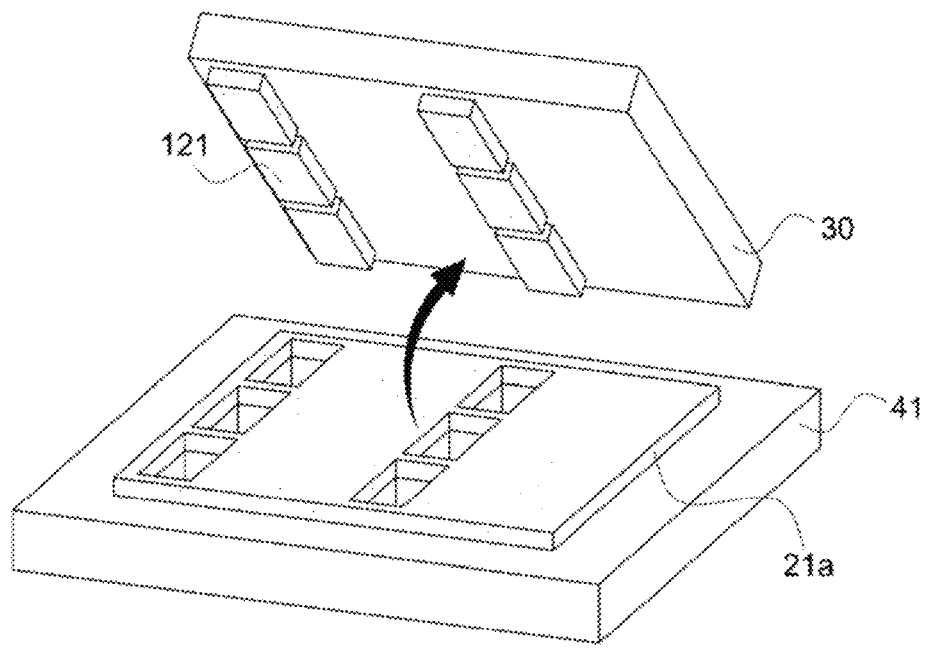

Referring to FIG. 13, the stamp 30 is separated from the first intaglio substrate 41. Since the surface energy of the first intaglio substrate 41 is greater than that of the stamp 30, the portion 21a of the first quantum dot layer being in contact with the first intaglio substrate 41 is separated from the stamp 30 to remain on the surface of the first intaglio substrate 41. Since the portion corresponding to the recess area 41a is adhered to the stamp 30, that portion is picked up to form a first quantum dot pattern 121.

Figure 14:
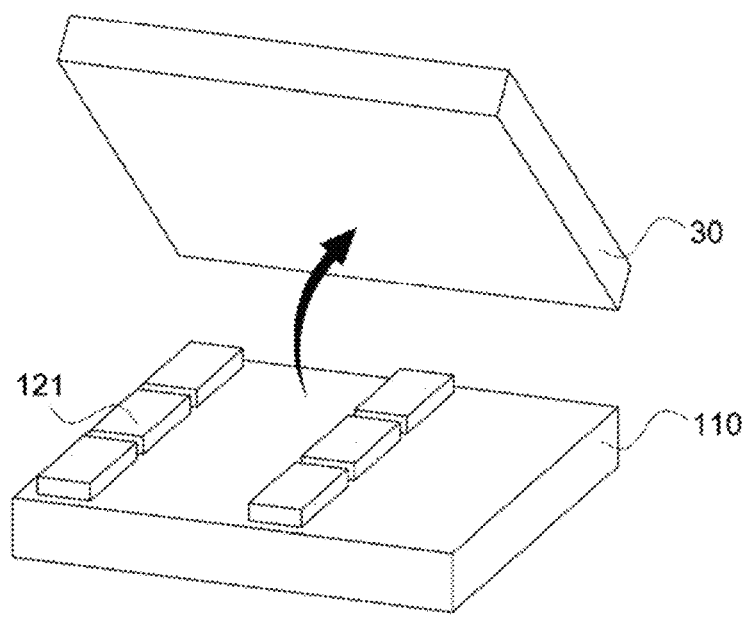

Referring to FIG. 14, the stamp 30 is aligned on a substrate 110, and the first quantum dot pattern 121 is transferred to the substrate 110. It is possible to transfer the first quantum dot pattern 121 from the stamp 30 to the substrate 110 by putting the stamp 30 with the first quantum dot pattern 121 thereon into contact with the substrate 110 and separating the stamp 30 from the substrate 110. The substrate 110 may be a wearable substrate, a flexible substrate, a stretchable substrate or a plastic substrate. It is preferable that a portion being in contact with the first quantum dot pattern 121 in the substrate 110 is formed of a substance whose surface energy is greater than the surface energy of the stamp 30.

Figure 15:
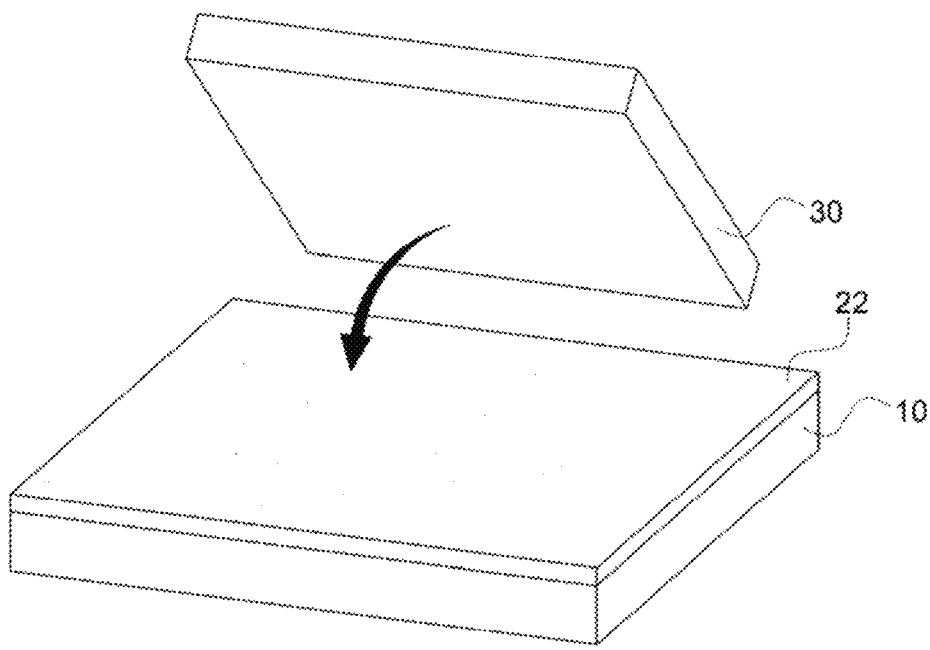

Referring to FIG. 15, a second quantum dot layer 22 is formed on a donor substrate 10. The second quantum dot layer 22 may be formed of a green quantum dot. For example, the second quantum dot layer 22 may be formed of a colloid nanocrystal substance including a CdSe/ZnS quantum dot and the like. Before forming the second quantum dot layer 22, a surface treatment of the donor substrate 10 may be performed by ODTS (octadecyltrichlorosilane) and the like.

Figure 16:
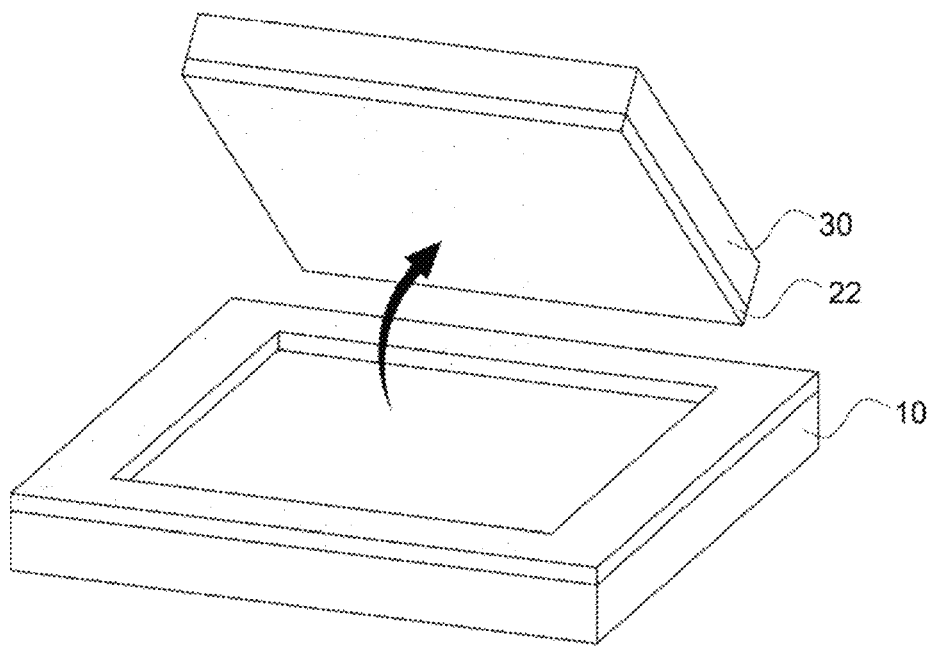

Referring to FIG. 16, the second quantum dot layer 22 is separated from the donor substrate 10 by a stamp 30 to be picked up. If the separation is carried out at a rate of 10 cm/s after putting the stamp 30 into contact with the second quantum dot layer 22, the second quantum dot layer 22 being in contact with the bottom face of the stamp 30 can be separated from the donor substrate 10 to be picked up.

Figure 17:
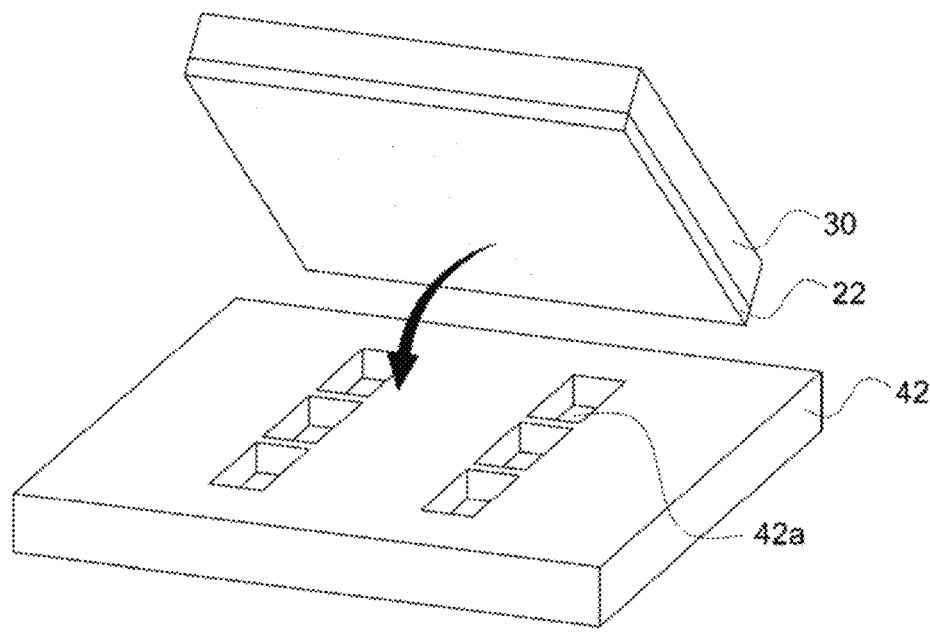

Referring to FIG. 17, the stamp 30 on which the second quantum dot layer 22 is formed is disposed and aligned on a second intaglio substrate 42. The surface energy of the second intaglio substrate 42 is greater than the surface energy of the stamp 30. For example, the second intaglio substrate 42 may be formed of materials meeting the surface energy requirement such as silicone, polymer, glass, organic material, oxide, etc. The second intaglio substrate 42 has a recess area 42a that is concavely formed from its surface to its inside.

Figure 18:
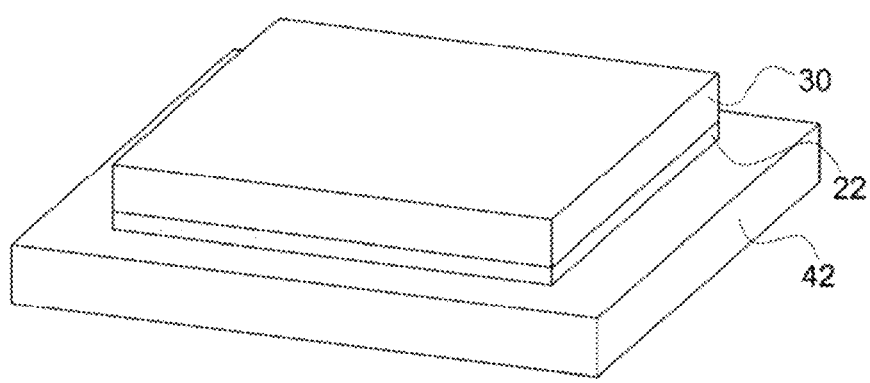

Referring to FIG. 18, the second quantum dot layer 22 is put into contact with the second intaglio substrate 42. Some pressure may be put on the whole stamp 30 in order that the second quantum dot layer 22 keeps uniformly in contact with the second intaglio substrate 42. At this time, the second quantum dot layer 22 is in contact with the second intaglio substrate 42 at a portion other than the recess area 42a. The second quantum dot layer 22 is not in contact with the second intaglio substrate 42 at a portion corresponding to the recess area 42a.

Figure 19:
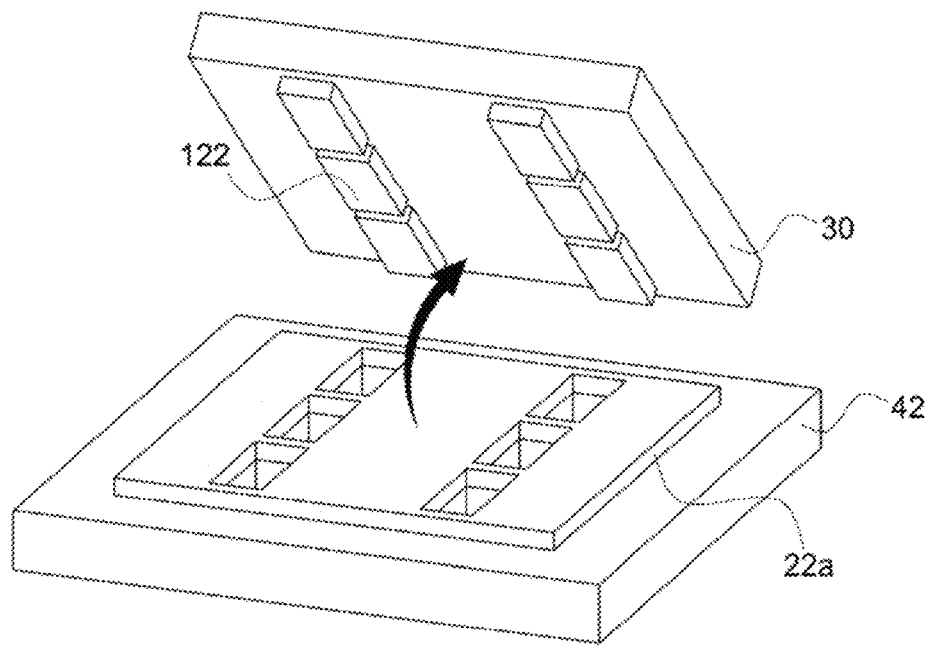

Referring to FIG. 19, the stamp 30 is separated from the second intaglio substrate 42. Since the surface energy of the second intaglio substrate 42 is greater than that of the stamp 30, the portion 22a of the second quantum dot layer being in contact with the second intaglio substrate 42 is separated from the stamp 30 to remain on the surface of the second intaglio substrate 42. Since the portion corresponding to the recess area 42a is adhered to the stamp 30, that portion is picked up to form a second quantum dot pattern 122.

Figure 20:
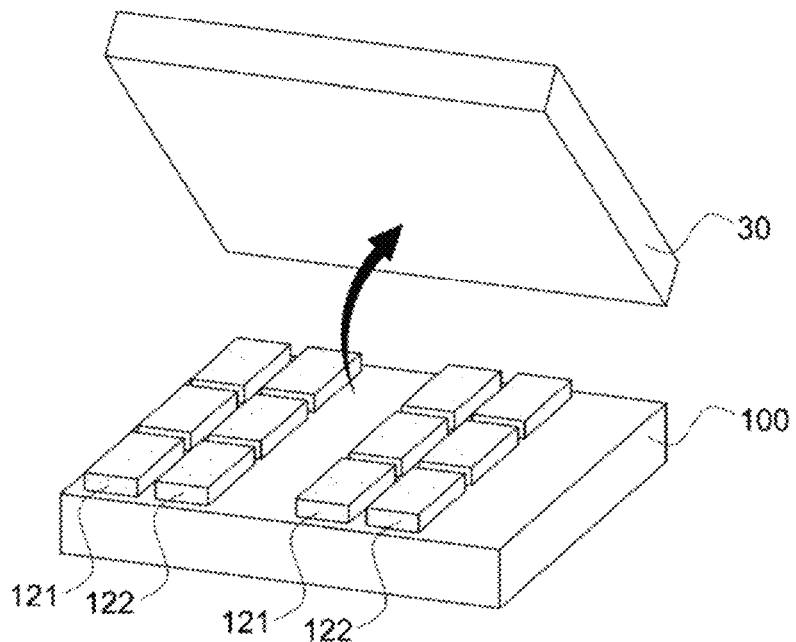

Referring to FIG. 20, the stamp 30 is aligned on a substrate 110, and the second quantum dot pattern 122 is transferred to the substrate 110. It is possible to transfer the second quantum dot pattern 122 from the stamp 30 to the substrate 110 by putting the stamp 30 with the second quantum dot pattern 122 thereon into contact with the substrate 110 and separating the stamp 30 from the substrate 110.

Figure 21:
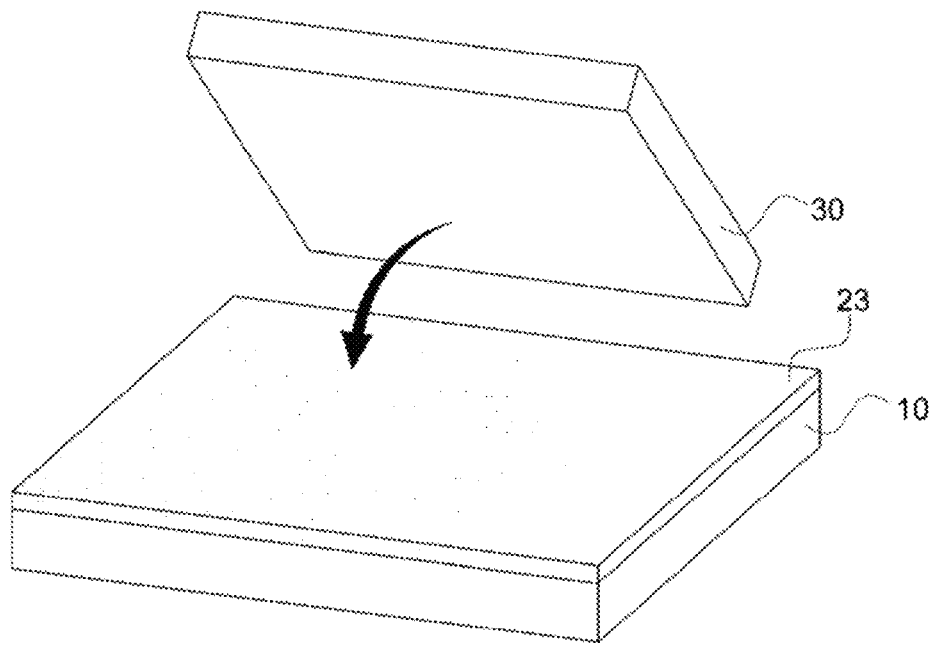

Referring to FIG. 21, a third quantum dot layer 23 is formed on a donor substrate 10. The third quantum dot layer 23 may be formed of a blue quantum dot. For example, the third quantum dot layer 23 may be formed of a colloid nanocrystal substance including a CdSe/ZnS quantum dot and the like. Before forming the third quantum dot layer 23, a surface treatment of the donor substrate 10 may be performed by ODTS (octadecyltrichlorosilane) and the like.

Figure 22:
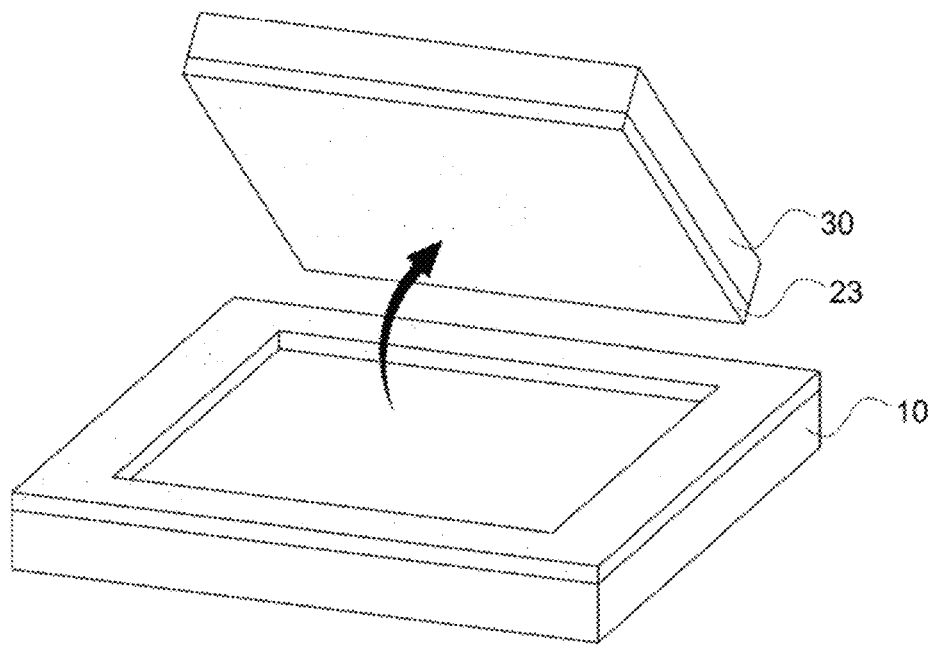

Referring to FIG. 22, the third quantum dot layer 23 is separated from the donor substrate 10 by a stamp 30 to be picked up. If the separation is carried out at a rate of 10 cm/s after putting the stamp 30 into contact with the third quantum dot layer 23, the third quantum dot layer 23 being in contact with the bottom face of the stamp 30 can be separated from the donor substrate 10 to be picked up.

Figure 23:
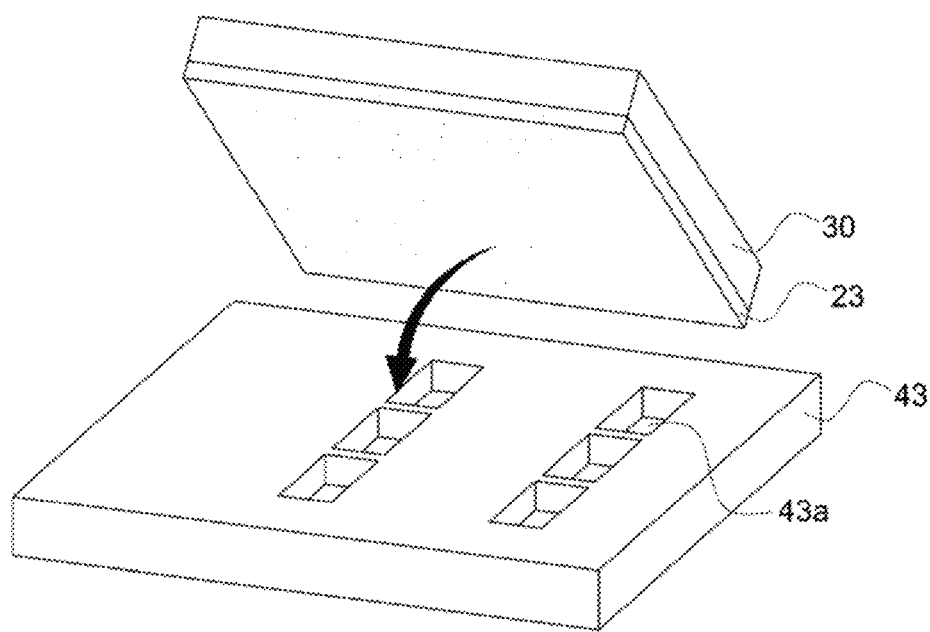

Referring to FIG. 23, the stamp 30 on which the third quantum dot layer 23 is formed is disposed and aligned on a third intaglio substrate 43. The surface energy of the third intaglio substrate 43 is greater than the surface energy of the stamp 30. For example, the third intaglio substrate 43 may be formed of materials meeting the surface energy requirement such as silicone, polymer, glass, organic material, oxide, etc. The third intaglio substrate 43 has a recess area 43a that is concavely formed from its surface to its inside.

Figure 24:
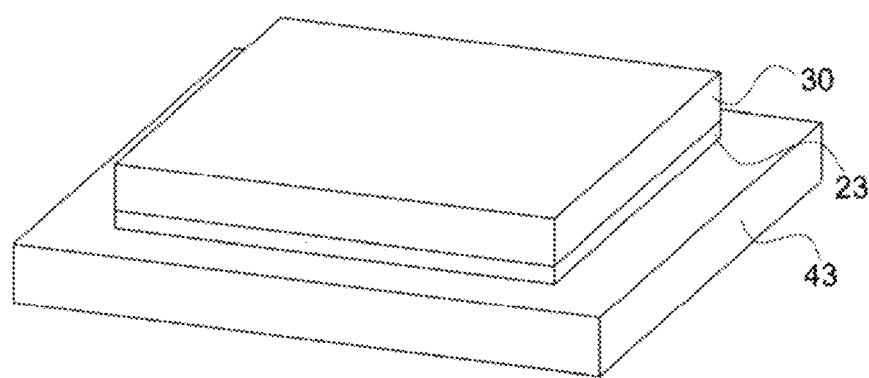

Referring to FIG. 24, the third quantum dot layer 23 is put into contact with the third intaglio substrate 43. Some pressure may be put on the whole stamp 30 in order that the third quantum dot layer 23 keeps uniformly in contact with the third intaglio substrate 43. At this time, the third quantum dot layer 23 is in contact with the third intaglio substrate 43 at a portion other than the recess area 43a. The third quantum dot layer 23 is not contact with the third intaglio substrate 43 at a portion corresponding to the recess area 43a.

Figure 25:
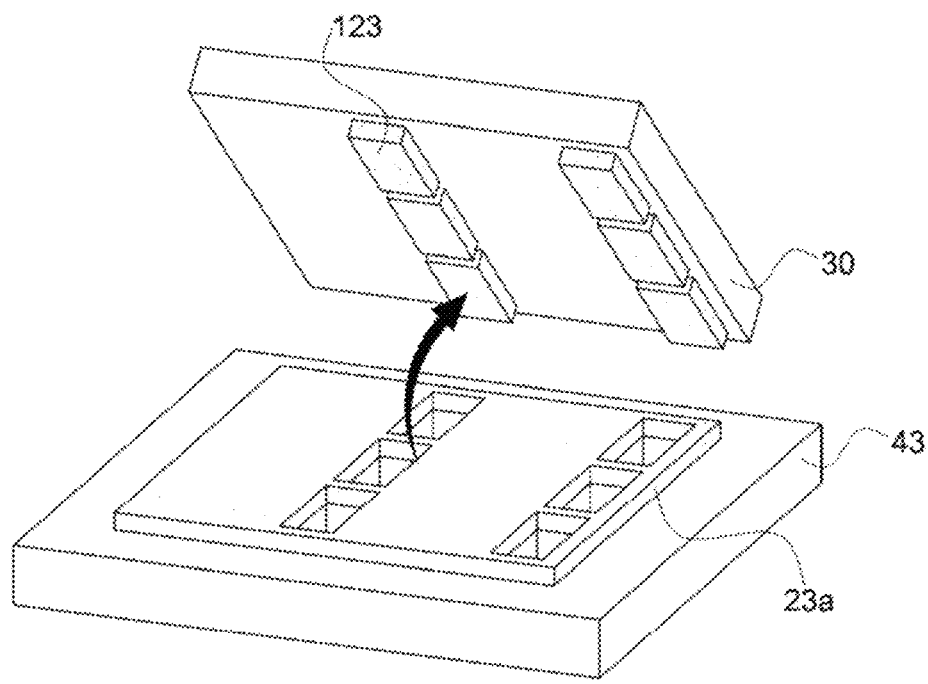

Referring to FIG. 25, the stamp 30 is separated from the third intaglio substrate 43. Since the surface energy of the third intaglio substrate 43 is greater than that of the stamp 30, the portion 23a of the third quantum dot layer being in contact with the third intaglio substrate 43 is separated from the stamp 30 to remain on the surface of the third intaglio substrate 43. Since the portion corresponding to the recess area 43a is adhered to the stamp 30, that portion is picked up to form a third quantum dot pattern 123.

Figure 26:
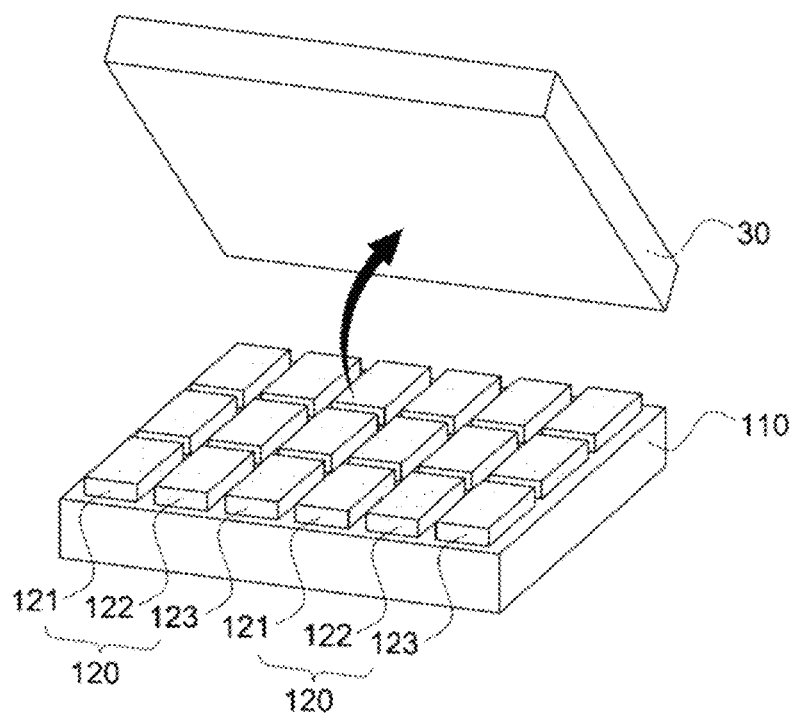

Referring to FIG. 26, the stamp 30 is aligned on a substrate 110, and the third quantum dot pattern 123 is transferred to the substrate 110. It is possible to transfer the third quantum dot pattern 123 from the stamp 30 to the substrate 110 by putting the stamp 30 with the third quantum dot pattern 123 thereon into contact with the substrate 110 and separating the stamp 30 from the substrate 110.

As described above, the quantum dot pattern 120 (for example, a RGB array) including the first quantum dot pattern 121, the second quantum dot pattern 122 and the third quantum dot pattern 123 can be aligned and formed on the substrate 110 by carrying out the intaglio transfer printing 3 times.

Figure 27:
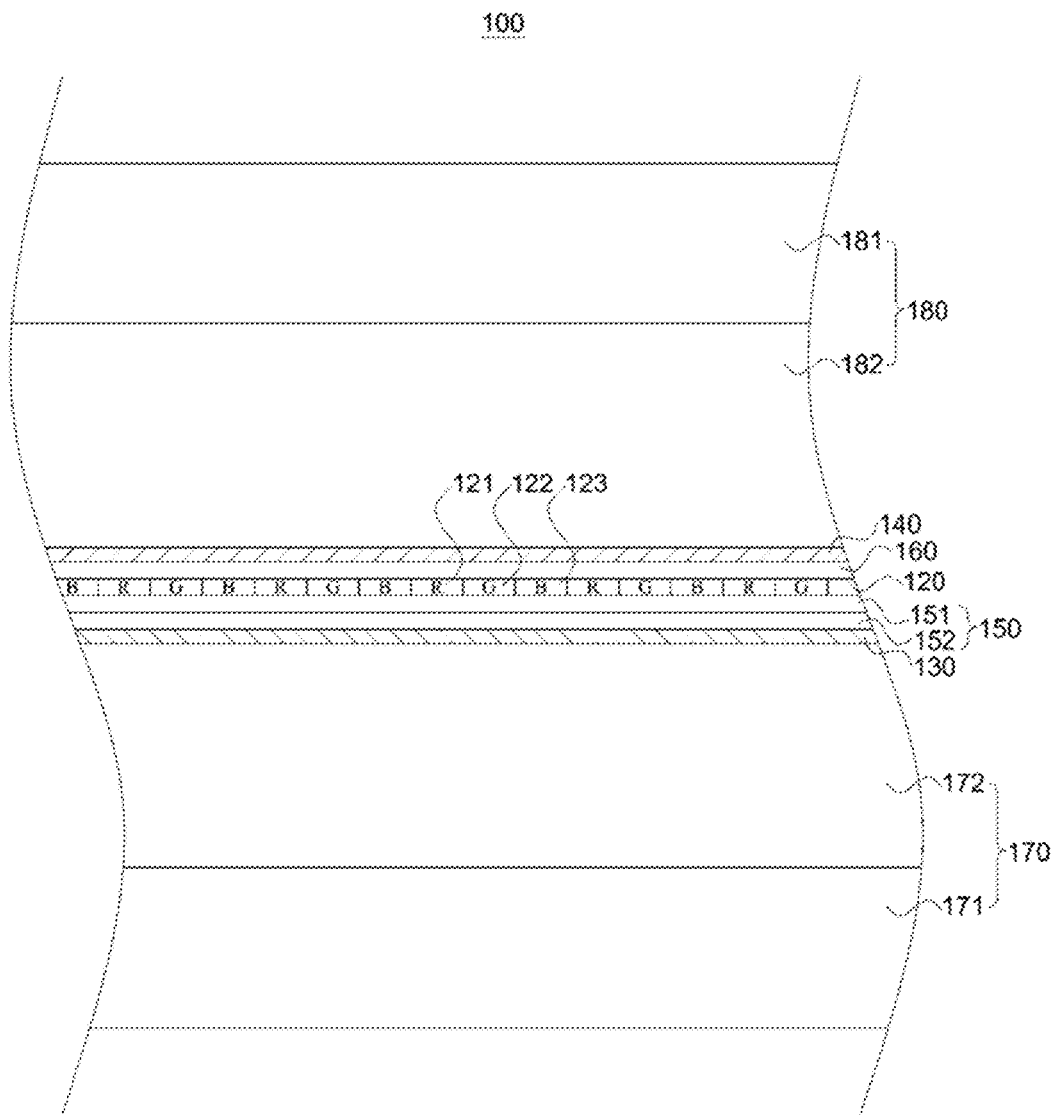
FIG. 27 shows a quantum dot electronic device according to a third embodiment of the present invention.

FIG. 27 shows a quantum dot electronic device according to a third embodiment of the present invention.

Referring to FIG. 27, a quantum dot electronic device 100 may have a structure where a first encapsulation layer 170, a first electrode 130, a quantum dot pattern 120, a second electrode 140 and a second encapsulation layer 180 are stacked in order. In addition, the quantum dot electronic device 100 may further include a first charge transportation layer 150 disposed between the quantum dot pattern 120 and the first electrode 130, and a second charge transportation layer 160 disposed between the quantum dot pattern 120 and the second electrode 140.

The quantum dot pattern 120 may include a quantum dot. For example, the quantum dot pattern 120 is formed of a colloid nanocrystal substance including a CdSe/ZnS quantum dot, a CdSe/Cds/ZnS quantum dot, etc. The quantum dot may have a shell for stability, and have luminescence quantum yield of about 80% or more.

The quantum dot pattern 120 may be formed by an intaglio transfer printing method (See FIGS. 2 to 7 or FIGS. 9 to 26). The intaglio transfer printing method enables the quantum dot pattern 120 having a size of about 20 μm×20 μm or less to be formed in uniform shape and size between the first and second electrodes 130 and 140 (or between the first and second charge transportation layers 150 and 160). Thus, a high integrated electronic device exhibiting excellent performance can be realized. The quantum dot electronic device 100 can be applied to various electronic devices including a light emitting device. In particular, the quantum dot electronic device 100 can be easily applied to a wearable electronic device.

The quantum dot pattern 120 may include a first quantum dot pattern 121, a second quantum dot pattern 122 and a third quantum dot pattern 123. For example, the first quantum dot pattern 121 may be a red quantum dot pattern including a red quantum dot and be formed of a colloid nanocrystal substance including a CdSe/CdS/ZnS quantum dot and the like. The second quantum dot pattern 122 may be a green quantum dot pattern including a green quantum dot and be formed of a colloid nanocrystal substance including a CdSe/ZnS quantum dot and the like. The third quantum dot pattern 123 may be a blue quantum dot pattern including a blue quantum dot and be formed of a colloid nanocrystal substance including a CdSe/ZnS quantum dot and the like. When the quantum dot pattern 120 consists of the red quantum dot pattern, the green quantum dot pattern and the blue quantum dot pattern, the quantum dot pattern 120 can function as a light emitting layer. By the quantum dot pattern 120 according to the embodiment of the present invention, the quantum dot electronic device 100 can be applied and expanded to various applications such as an ultrathin film type quantum dot electronic device and an electronic tattoo and the like, and have high electroluminescence performance.

The first electrode 130 can function as a positive electrode. In order to easily inject holes into the first charge transportation layer 150, the first electrode 130 may be formed of a substance with a high work function such as Indium Tin Oxide (ITO) and the like.

The second electrode 140 can function as a negative electrode. In order to easily inject electrons into the second charge transportation layer 160, the second electrode 140 may be formed of a substance with a low work function. For example, the substance with a low work function may be a metal such as Lithium (Li), Aluminum (Al) and the like or an alloy of these metals. Although not illustrated in FIG. 27, a patterning for the second electrode 140 may be performed in order for the second electrode 140 to correspond to the quantum dot pattern 120. In this case, the quantum dot electronic device 100 can be used as a quantum dot light emitting device.

The first charge transportation layer 150 may include a hole transportation layer 151 and a hole injection layer 152.

The hole transportation layer 151 may be formed of a substance that can easily transport holes to the quantum dot pattern 120. For example, the hole transportation layer 151 may be formed of a high molecule material such as TFB (poly[(9,9-dioctylfluorenyl-2,7-diyl)-co-(4,4-(N-(4-sec-butylphenyl))diphenylamine)]) and the like. The hole injection layer 152 may be formed of a substance that has an excellent interfacial property, and can easily receive holes from the first electrode 130 or transport electrons to the first electrode 130. For example, the hole injection layer 152 may be formed of a high molecule material such as PEDOT:PSS (poly(3,4-ethylenedioxythiophene):poly(styrenesulfonate)) and the like.

The second charge transportation layer 160 functions as an electron transportation layer and may be formed of a substance that can easily transport electrons to the quantum dot pattern 120. For example, the second charge transportation layer 160 may be formed of metal oxide nanocrystal or metal oxide such as ZnO and the like.

The first encapsulation layer 170 may include a first protection layer 171 and a first adhesion layer 172, and the second encapsulation layer 180 may include a second protection layer 181 and a second adhesion layer 182. For example, the first and second protection layers 171 and 181 may be formed of poly(p-xylylene) and the like. They are disposed at upper and lower faces of the quantum dot electronic device 100, respectively. They can prevent components between them from oxidizing, and play various roles for protecting and supporting components inside the quantum dot electronic device 100. For example, the first and second adhesion layers 172 and 182 may be formed of an epoxy resin and the like. They can prevent the first and second protection layers 171 and 181 from being peeled off.

Since the quantum dot pattern 120 is formed by the intaglio transfer printing method, it is possible to fabricate the quantum dot electronic device with an ultrathin film. Concretely, the thickness of the quantum dot electronic device 100 can be about 3 μm or less. The sum of the thickness of the quantum dot pattern 120, the first electrode 130, the second electrode 140, the first charge transportation layer 150 and the second charge transportation layer 160 that correspond to components other than the first and second encapsulation layers 170 and 180 can be about 300 nm or less.

Figure 28:
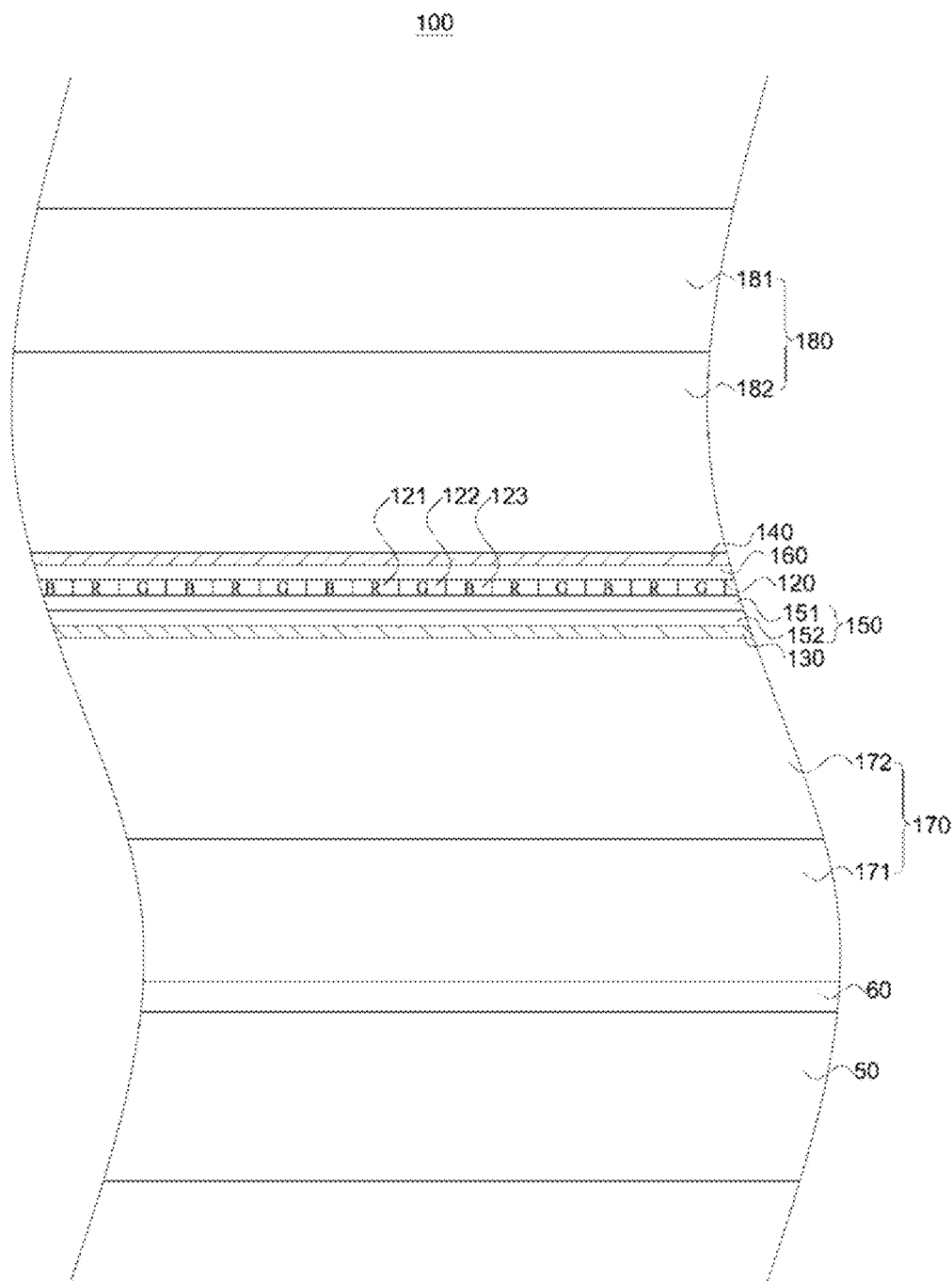
FIG. 28 is a view explaining one example of a method for fabricating the quantum dot electronic device of FIG. 27.

FIG. 28 is a view explaining one example of a method for fabricating the quantum dot electronic device of FIG. 27.

Referring to FIG. 28, a sacrifice layer 60 is formed on a silicon substrate 50. The sacrifice layer 60 may be formed of nickel by using a thermal deposition process.

A first encapsulation layer 170 including a first protection layer 171 and a first adhesion layer 172 is formed on the sacrifice layer 60. The first protection layer 171 may be formed of poly(p-xylylene) on the sacrifice layer 60 by using a spin coating process. The first adhesion layer 172 may be formed of an epoxy resin on the first protection layer 171 by using a spin coating process. The first protection layer 171 may have the thickness of about 500 nm, and the first adhesion layer 172 may have the thickness of about 700 nm. An annealing process is carried out at 95° C. for 1 minute and at 150° C. for 30 minutes by exposing to ultraviolet rays after forming the first encapsulation layer 170. The first adhesion layer 172 can have an ultra-flat surface through a reflow process.

A first electrode 130 is formed on the first encapsulation layer 170. The first electrode 130 can be formed by patterning an ITO (Indium Tin Oxide) layer deposited on the first encapsulation layer 170 using a sputtering process (50 W, 30 minutes, 5 mTorr, 200° C.). A surface treatment of the first electrode 130 may be performed by ultraviolet rays/ozone.

A first charge transportation layer 150 including a hole transportation layer 151 and a hole injection layer 152 is formed on the first electrode 130. The hole injection layer 152 may be formed of PEDOT:PSS on the first electrode 130 by using a spin coating process (2000 rpm, 30 seconds). After forming the hole injection layer 152, an annealing process for the hole injection layer 152 is carried out at 120° C. for 10 minutes at atmospheric pressure, and is also carried out at 150° C. for 10 minutes in a glove box in order to remove residual solvent. The hole transportation layer 151 may be formed of 0.5 wt % TFB in m-xylene on the hole injection layer 152 by using a spin coating process, and an annealing process for the hole transportation layer 151 is carried out at 150° C. in a glove box.

A quantum dot pattern 120 is formed on the first charge transportation layer 150. The quantum dot pattern 120 may include a first quantum dot pattern 121, a second quantum dot pattern 122 and a third quantum dot pattern 123. For example, the first quantum dot pattern 121 may be a red quantum dot pattern including a red quantum dot and be formed of a colloid nanocrystal substance including a CdSe/CdS/ZnS quantum dot and the like. The second quantum dot pattern 122 may be a green quantum dot pattern including a green quantum dot and be formed of a colloid nanocrystal substance including a CdSe/ZnS quantum dot and the like. The third quantum dot pattern 123 may be a blue quantum dot pattern including a blue quantum dot and be formed of a colloid nanocrystal substance including a CdSe/ZnS quantum dot and the like. The quantum dot pattern 120 may be formed by an intaglio transfer printing method (see FIGS. 8 to 26). After forming the quantum dot pattern 120, an annealing process for the quantum dot pattern 120 is carried out at 150° C. in a glove box.

A second charge transportation layer 160 is formed on the quantum dot pattern 120. The second charge transportation layer 160 may be formed of ZnO nanocrystal in butanol on the quantum dot pattern 120 by using a spin coating process.

A second electrode 140 is formed on the second charge transportation layer 160. The second electrode 140 may be formed by patterning an alloy of LiAl deposited on the second charge transportation layer 160 using a thermal deposition process. The second electrode 140 can be patterned so as to correspond to the quantum dot pattern 120.

A second encapsulation layer 180 including a second protection layer 181 and a second adhesion layer 182 is formed on the second electrode 140. The second adhesion layer 182 may be formed of an epoxy resin on the second electrode 140 by using a spin coating process, and the second protection layer 181 may be formed of poly(p-xylylene) on the second adhesion layer 182 by using a spin coating process. The second protection layer 181 may have the thickness of about 500 nm, and the second adhesion layer 182 may have the thickness of about 700 nm. After forming the second encapsulation layer 180, an annealing process for the second encapsulation layer 180 is carried out at 95° C. for 1 minute and at 150° C. for 30 minutes by exposing to ultraviolet rays. The second adhesion layer 182 can have an ultra-flat surface by using a reflow process.

The silicon substrate 50 is separated from the first encapsulation layer 170 by removing the sacrifice layer 60. By this, a quantum dot electronic device (See reference numeral 100 in FIG. 27) can be formed. The sacrifice layer 60 may be removed by an etching process using nickel etching solvent.

Figure 29A:
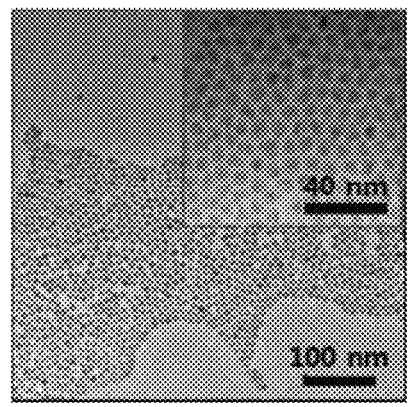
FIGS. 29a to 29f are views explaining features of a quantum dot used in the quantum dot electronic device according to embodiments of the present invention.
Figure 29B:
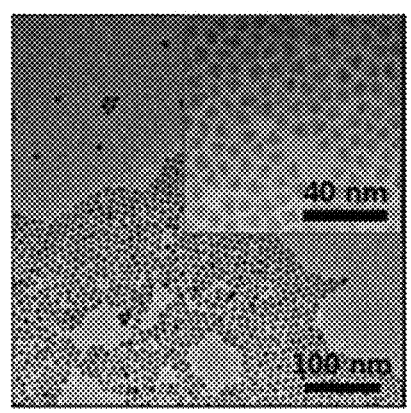
Figure 29C:
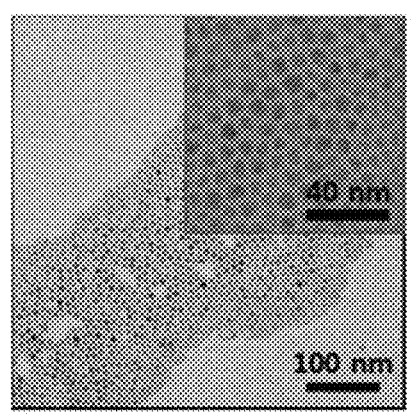
Figure 29D:
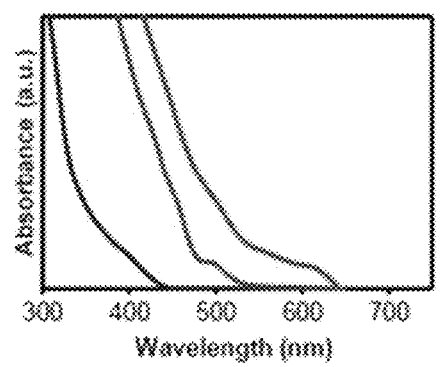
Figure 29E:
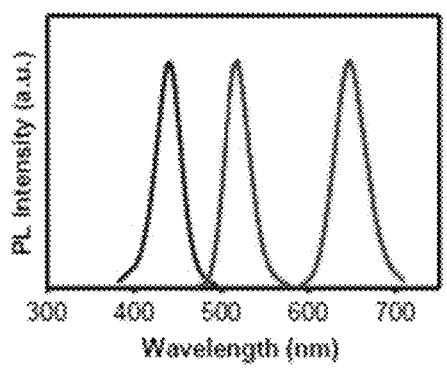
Figure 29F:
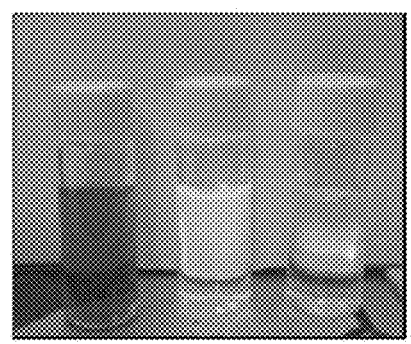

FIGS. 29a to 29f are views explaining features of a quantum dot used in the quantum dot electronic device according to embodiments of the present invention. FIG. 29a shows a TEM image of a CdSe/CdS/ZnS quantum dot that is a red quantum dot, FIG. 29b shows a TEM image of a CdSe/ZnS quantum dot that is a green quantum dot, FIG. 29c shows a TEM image of a CdSe/ZnS quantum dot that is a blue quantum dot, FIG. 29d shows an absorption spectrum of the red, green and blue quantum dots, FIG. 29e shows an electroluminescence spectrum of the red, green and blue quantum dots, and FIG. 29f shows a picture of each solution of the red, green and blue quantum dots under the state where they are excited by ultraviolet rays. Referring to FIGS. 29a to 29f, the CdSe/CdS/ZnS quantum dot can function excellently as the red quantum dot, and the CdSe/ZnS quantum dot can function excellently as the green and blue quantum dots.

Figure 30A:
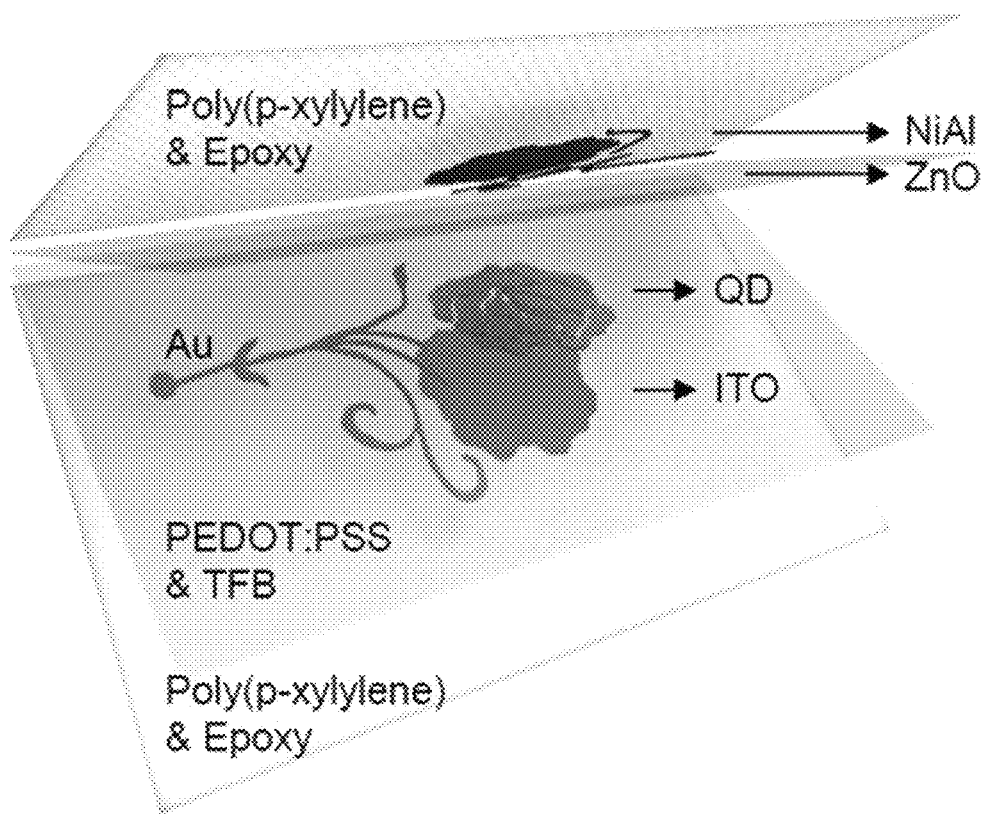
FIG. 30a is an exploded perspective view showing an electronic tattoo where the quantum dot electronic device of FIG. 27 is applied.
Figure 30B:
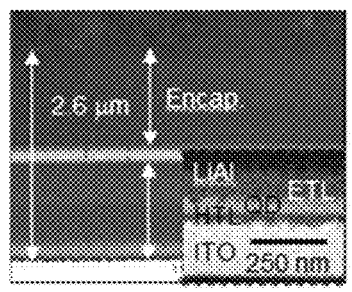
FIG. 30b is a SEM image showing a cross section of the electronic tattoo.
Figure 30C:
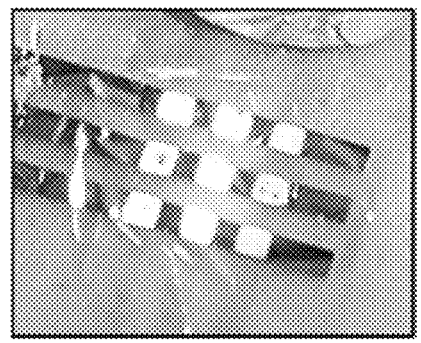
FIGS. 30c and 30d are pictures taken from a state where the electronic tattoo is attached to person's skin.
Figure 30D:

FIG. 30a is an exploded perspective view showing an electronic tattoo where the quantum dot electronic device of FIG. 27 is applied, FIG. 30b is a SEM image showing a cross section of the electronic tattoo, and FIGS. 30c and 30d are pictures taken from a state where the electronic tattoo is attached to person's skin.

Referring to FIGS. 30a and 30b, in the electronic tattoo, the sum of the thickness of a quantum dot pattern (QD), a first electrode (ITO), a second electrode (NiAl), a first charge transportation layer (PEDOT:PSS & TFB) and a second charge transportation layer (ZnO) is about 300 nm or less. In addition, the sum of the thickness of the electronic tattoo including first and second encapsulation layers (Poly (p-xylylene) & Epoxy) is about aim or less. The electronic tattoo can be diversely transformed, and conformal integrations on smooth curved skin tissue are possible by using it. Although the electronic tattoo has an ultrathin film, it exhibits excellent performance in brightness and efficiency.

Furthermore, after taking uniaxial stretching tests (application of 20% strain) 1000 times, the electroluminescence performance can be stably maintained.

Referring to FIGS. 30c and 30d, even though the electronic tattoo is bent by person's skin, there is no difference in the electroluminescence performance of the electronic tattoo between before and after being bent. That is, even though the electronic tattoo is bent, folded or crumpled, it can be laminated on various substrates such as person's skin, aluminum foil and glass without the decrease of the electroluminescence performance. The electronic tattoo is not impaired mechanically or electrically despite the transformation such as bending, crumpling, wrinkling, etc. Therefore, the quantum dot electronic device can be easily applied to a wearable electronic device.

Figure 31A:
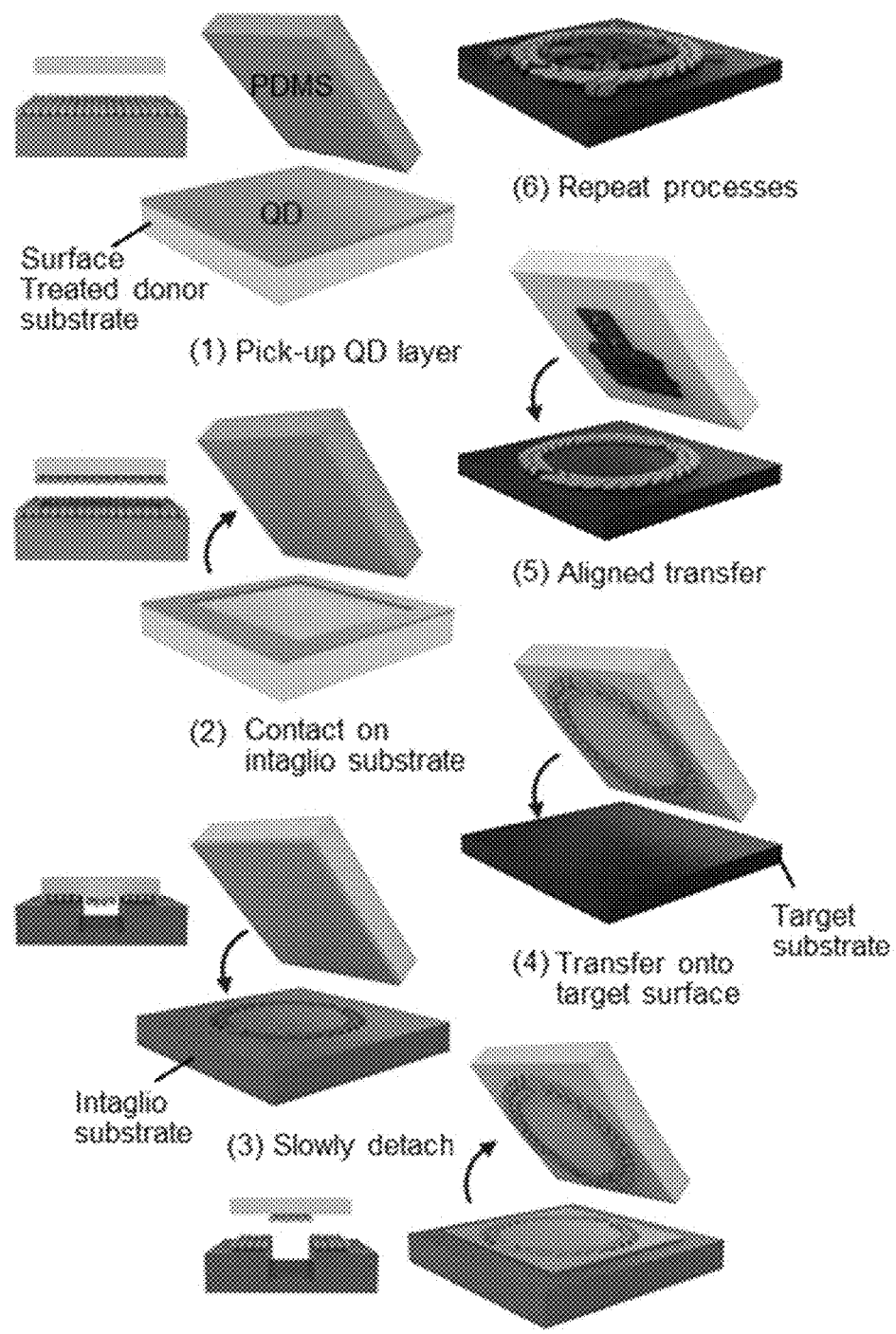
FIG. 31a schematically shows an intaglio transfer printing method according to embodiments of the present invention.
Figure 31B:
FIGS. 31b to 31e show a quantum dot pattern formed by the intaglio transfer printing method.
Figure 31C:
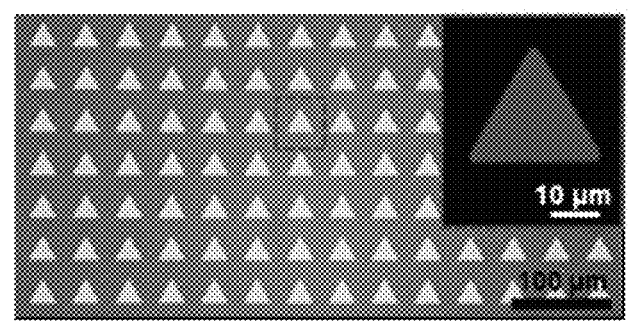
Figure 31D:
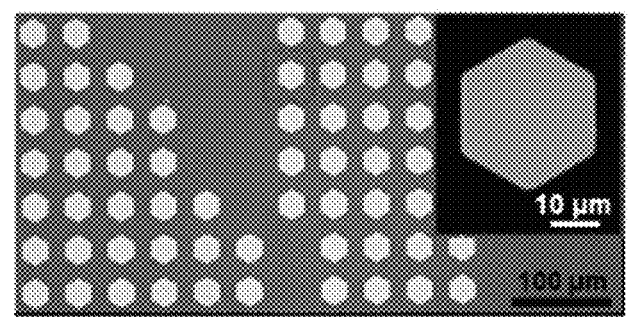
Figure 31E:
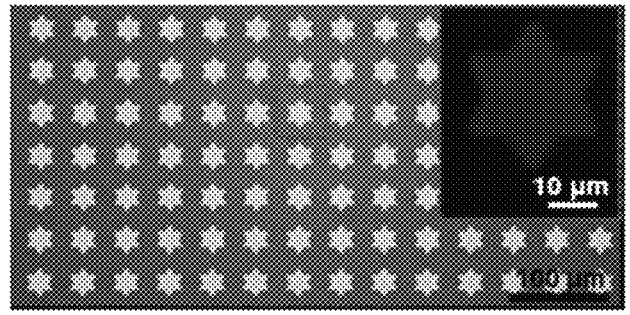

FIG. 31a schematically shows an intaglio transfer printing method according to embodiments of the present invention, and FIGS. 31b to 31e show a quantum dot pattern formed by the intaglio transfer printing method. FIGS. 31c, 31d and 31e represent enlarged views of a first area i, a second area ii, and a third area iii of FIG. 31b, respectively.

Referring to FIG. 31a, a green quantum dot layer (QD layer) is formed on a surface treated donor substrate, and the green quantum dot layer is picked up by a PDMS stamp (PDMS). The pick-up green quantum dot layer is put into contact with an intaglio substrate and then is picked up again by the PDMS stamp. At this time, the portion of the green quantum dot layer that is in contact with the intaglio substrate remains on the intaglio substrate 40. In addition, the portion of the green quantum dot layer that corresponds to a recess area of the intaglio substrate and thus is not in contact with the intaglio substrate, forms a green quantum dot pattern on the surface of the PDMS stamp. The green quantum dot pattern is transferred to a target substrate by the PDMS stamp. Blue quantum dot pattern and red quantum dot pattern are formed on the target substrate by repeating these steps.

Referring to FIGS. 31b to 31e, the green quantum dot pattern, the blue quantum dot pattern and the red quantum dot pattern can be uniformly transferred at a high transfer rate regardless of shape, size and array. In addition, even the quantum dot patterns having a size of about 20 µm×20 µm or less are uniformly transferred at a very high transfer rate.

Figure 32:
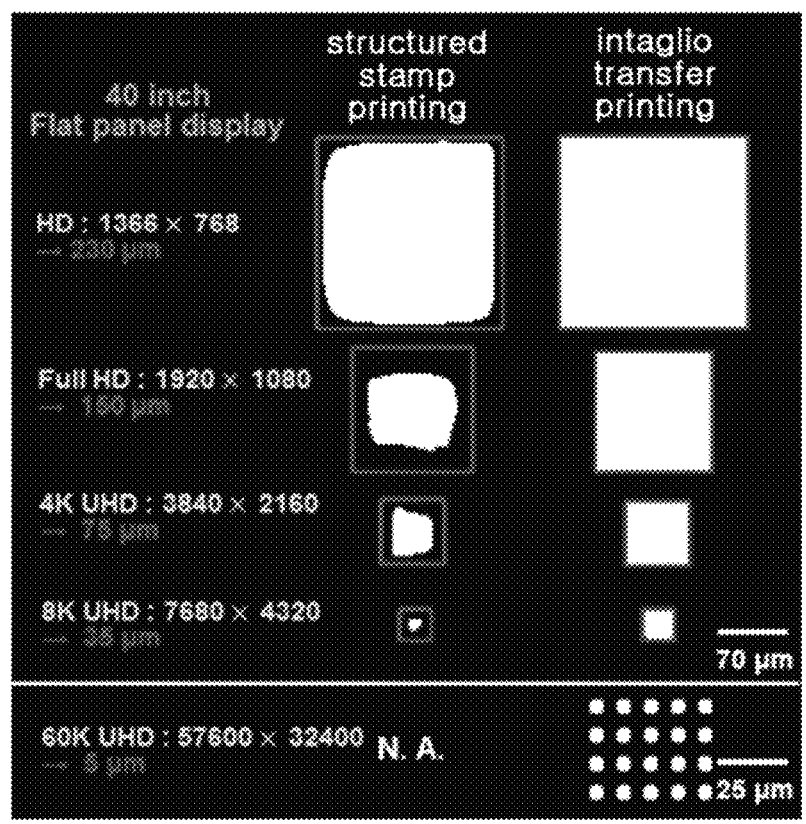
FIG. 32 is a view explaining a difference in a transfer rate of the quantum dot pattern when comparing the intaglio transfer printing method and a structured stamp printing method.

FIG. 32 is a view explaining a difference in a transfer rate of the quantum dot pattern when comparing the intaglio transfer printing method and a structured stamp printing method. In the structured stamp printing method, instead of the intaglio substrate according to the embodiments of the present invention, a quantum dot pattern is transferred from a donor substrate to a target substrate by forming a structure corresponding to the quantum dot pattern to be transferred on the surface of the stamp.

Referring to FIG. 32, according to the intaglio transfer printing method, even the quantum dot patterns having a size of about 5 µm×5 µm can be transferred at a high transfer rate of almost 100%. However, according to the structured stamp printing method, even the quantum dot patterns having a size of about 230 µm×230 µm are not transferred near edges.

Figure 33A:
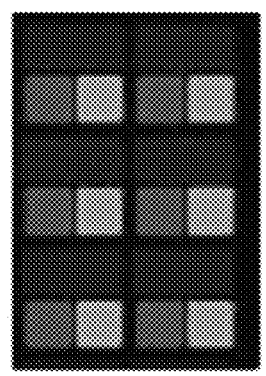
FIGS. 33a to 33d show electroluminescence images with different resolution in the quantum dot light emitting device according to embodiments of the present invention.
Figure 33B:
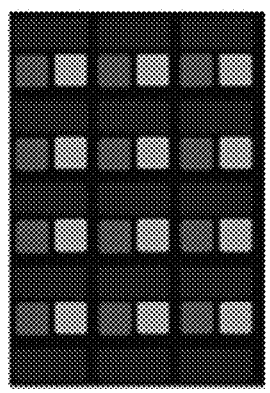
Figure 33C:
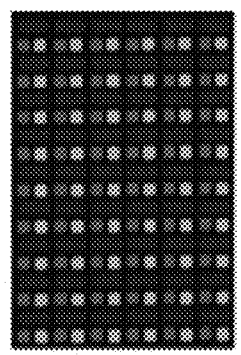
Figure 33D:
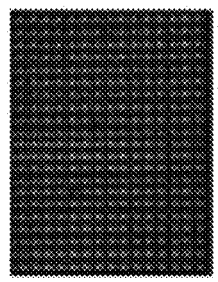

FIGS. 33a to 33d show electroluminescence images of different resolution in the quantum dot light emitting device according to embodiments of the present invention. FIG. 33a shows the electroluminescence image of 326 ppi resolution, FIG. 33b shows the electroluminescence image of 441 ppi resolution, FIG. 33c shows the electroluminescence image of 882 ppi resolution, and FIG. 33d shows the electroluminescence image of 2460 ppi resolution.

Referring to FIGS. 33a to 33d, aligned pixels of high resolution within the 326~2460 ppi can be easily formed, and the quantum dot light emitting device can be applied to an ultrahigh resolution display.

Figure 34A:
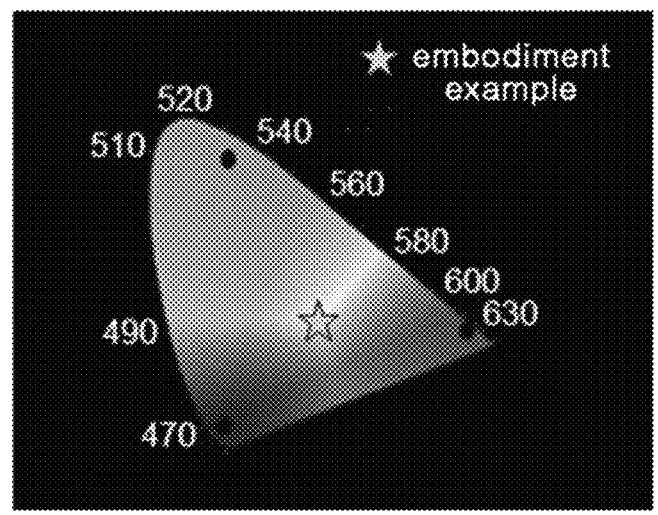
FIGS. 34a and 34b show a white color formed by the quantum dot pattern of the quantum dot light emitting device according to embodiments of the present invention.
Figure 34B:
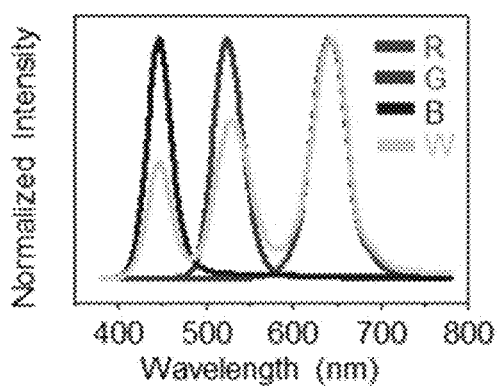

FIGS. 34a and 34b show a white color formed by the quantum dot pattern of the quantum dot light emitting device according to embodiments of the present invention.

Referring to FIGS. 34a and 34b, in the quantum dot light emitting device including the quantum dot pattern having a red quantum dot pattern, a green quantum dot pattern and a blue quantum dot pattern, electroluminescence consists of three divided peaks and each peak corresponds to a single color of red, green and blue. Light emitted by the quantum dot light emitting device corresponds to a color coordinate (0.39, 0.38) of Commission International de lEclairage (CIE) under the driving voltage of 5V, and this means that the quantum dot light emitting device emits true white light.

Figure 35A:
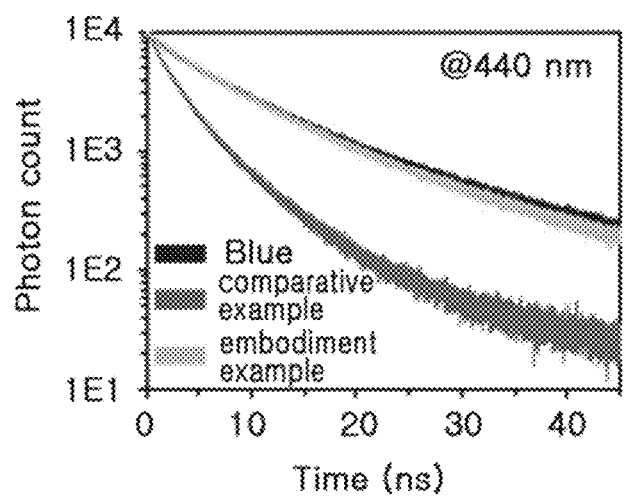
FIGS. 35a to 35c are graphs comparing light luminescence to time in a mixed quantum dot light emitting device and the quantum dot light emitting device according to embodiments of the present invention.
Figure 35B:
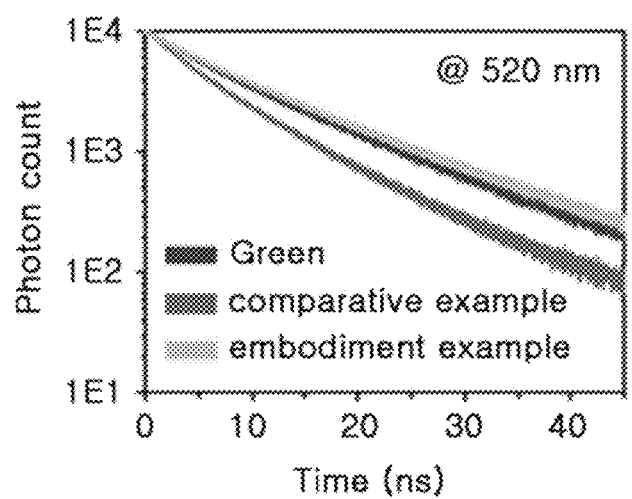
Figure 35C:
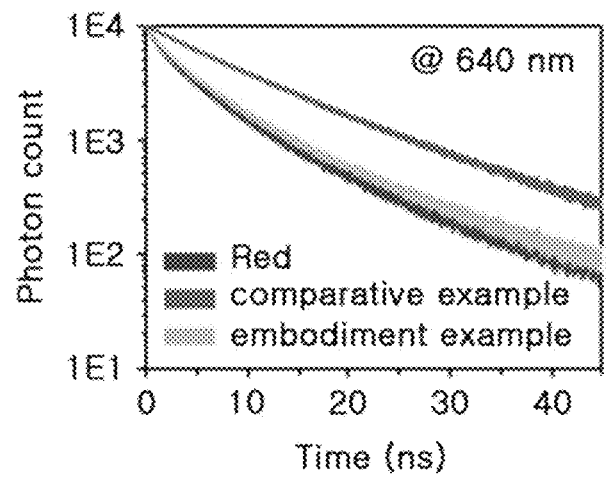

FIGS. 35a to 35c are graphs comparing light luminescence to time in a mixed quantum dot light emitting device and the quantum dot light emitting device according to embodiments of the present invention. The mixed quantum dot light emitting device is a light emitting device where red quantum dot, green quantum dot and blue quantum dot are mixed in one quantum dot pattern in order to generate a white color.

Referring to FIGS. 35a to 35c, in the mixed quantum dot light emitting device, the lifespan of the carrier of the green and blue quantum dots markedly decreases, and the lifespan of the carrier of the red quantum dot markedly increases. This means that energy transfer between the quantum dots occurs. Since the quantum dots with different colors are adjacent to each other within the concentrated quantum dot pattern, the quantum dots transfer energy to adjacent quantum dots having a low band gap instead of emitting photons outwardly. Because of the energy transfer between adjacent quantum dots with different colors, the performance of the mixed quantum dot light emitting device may decline. However, in case of the quantum dot light emitting device according to the embodiments of the present invention, since the red quantum dot pattern, the green quantum dot pattern and the blue quantum dot pattern are divided from each other, the energy transfer between the quantum dots with different colors is prevented. As a result, a white light emitting with high efficiency is possible in the quantum dot light emitting device according to the embodiments of the present invention.

Figure 36:
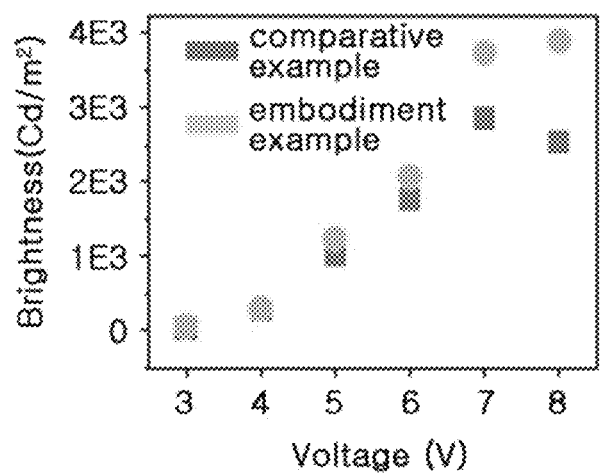
FIG. 36 is a graph comparing electroluminescence efficiency in a mixed quantum dot light emitting device and the quantum dot light emitting device according to embodiments of the present invention.

FIG. 36 is a graph comparing electroluminescence efficiency in a mixed quantum dot light emitting device and the quantum dot light emitting device according to embodiments of the present invention. Referring to FIG. 36, under various driving voltage, the brightness of the quantum dot light emitting device according to the embodiments of the present invention can be enhanced by 10~52% in comparison with the mixed quantum dot light emitting device.

Figure 37:
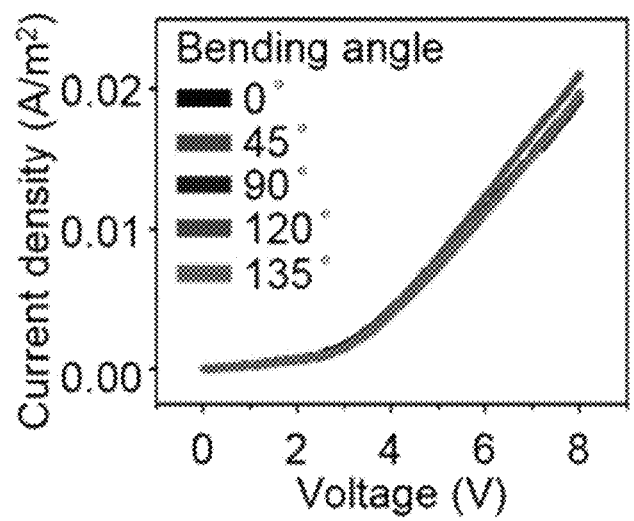
FIG. 37 is a graph showing a current density-voltage characteristic at a bending angle in the quantum dot light emitting device according to embodiments of the present invention.
Figure 38A:
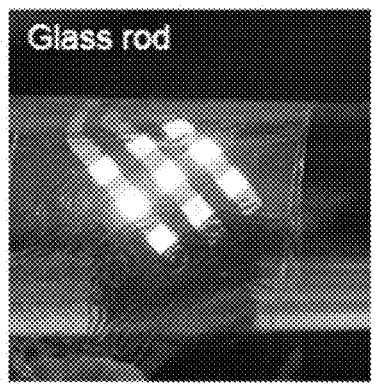
FIGS. 38a to 38e show examples of application of the quantum dot light emitting device according to embodiments of the present invention.
Figure 38B:
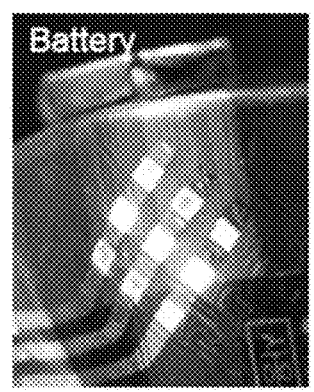
Figure 38C:
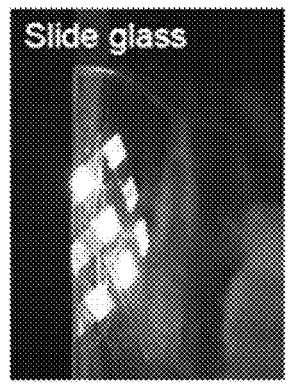
Figure 38D:
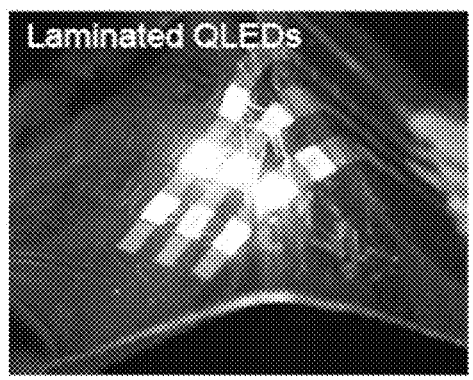
Figure 38E:
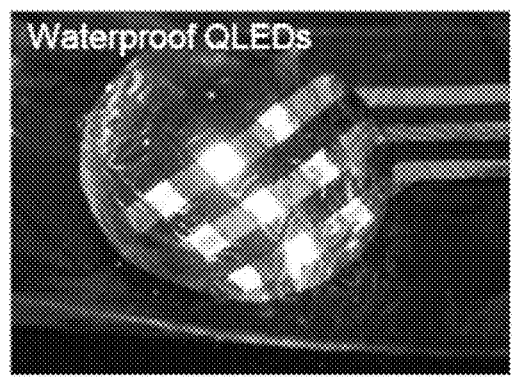

FIG. 37 is a graph showing a current density-voltage characteristic at a bending angle in the quantum dot light emitting device according to embodiments of the present invention. Referring to FIG. 37, the quantum dot light emitting device according to the embodiments of the present invention shows stable current density-voltage characteristics under various bending angles.

FIGS. 38a to 38e show examples of application of the quantum dot light emitting device according to embodiments of the present invention. Referring to FIGS. 38a to 38e, since the quantum dot light emitting device can be formed in an ultrathin film, it can be applied to various curved substrates such as glass rod, battery, slide glass, etc. In addition, it can be laminated in various shapes and forms to be used.

Although the embodiments of the present invention have been disclosed for illustrative purposes, those skilled in the art will appreciate that the present invention may be embodied in other specific ways without changing the technical spirit or essential features thereof. Therefore, the embodiments disclosed in the present invention are not restrictive but are illustrative. The scope of the present invention is given by the claims, rather than the specification, and also contains all modifications within the meaning and range equivalent to the claims.

INDUSTRIAL APPLICABILITY

According to a quantum dot transfer printing method according to embodiments of the present invention, a subminiature quantum dot pattern can be transferred at a high transfer rate. Accordingly, a high integrated quantum dot electronic device exhibiting excellent performance can be realized. The quantum dot electronic device can be applied to various electronic devices such as an ultrathin film electronic device, a wearable electronic device, a flexible electronic device, a stretchable electronic device and/or a skin attachment type electronic device, etc. In addition, its application can be expanded to various electronic devices such as a quantum dot light emitting device, an electronic tattoo and the like, and its performance can be enhanced.

Furthermore, by forming the quantum dot pattern through the quantum dot transfer printing method, an ultrathin wearable quantum dot light emitting device with high resolution and an ultrathin skin attachment type flexible (or stretchable) quantum dot light emitting device can be realized. In these quantum dot light emitting device, high resolution pixels having various colors can be formed, and a stable electroluminescence can be maintained under various transformation such as bending, crumpling, wrinkling and the like. A display device with high resolution of 1000 ppi or more can be realized from the wearable quantum dot light emitting device.

The invention claimed is:

1. A quantum dot electronic device comprising:
a first encapsulation layer;
a first electrode disposed on the first encapsulation layer;
a quantum dot pattern disposed on the first electrode;
a second electrode disposed on the quantum dot pattern; and
a second encapsulation layer disposed on the second electrode,
wherein the quantum dot pattern is formed by an intaglio transfer printing method that comprises:
forming a quantum dot layer on a donor substrate;
picking up the quantum dot layer using a stamp;
putting the quantum dot layer into contact with an intaglio substrate using the stamp; and
separating the stamp from the intaglio substrate.

2. The quantum dot electronic device of claim 1, further comprising:
a first charge transportation layer disposed between the first electrode and the quantum dot pattern; and
a second charge transportation layer disposed between the second electrode and the quantum dot pattern.

3. The quantum dot electronic device of claim 2, wherein a sum of thickness of the first encapsulation layer, the first electrode, the first charge transportation layer, the quantum dot pattern, the second charge transportation layer, the second electrode and the second encapsulation layer is about 3 µm or less, and a sum of thickness of the first electrode, the first charge transportation layer, the quantum dot pattern, the second charge transportation layer and the second electrode is about 300 nm or less.

4. The quantum dot electronic device of claim 1, wherein a surface energy of the intaglio substrate is greater than a surface energy of the stamp.

5. The quantum dot electronic device of claim 1, wherein a transfer rate of the quantum dot pattern by the intaglio transfer printing method is about 99% or more in a size of about 5 µm×5 µm or more.

6. The quantum dot electronic device of claim 1, wherein a size of the quantum dot pattern is about 20 µm×20 µm or less.

7. The quantum dot electronic device of claim 1, wherein the quantum dot pattern comprises a red quantum dot pattern, a green quantum dot pattern and a blue quantum dot pattern, and the quantum dot electronic device is a wearable quantum dot light emitting device.

8. The quantum dot electronic device of claim 1, wherein the quantum dot pattern is formed of a colloid nanocrystal substance comprising at least one of CdSe/ZnS quantum dot and CdSe/CdS/ZnS quantum dot.

9. The quantum dot electronic device of claim 1, wherein the first encapsulation layer comprises a first protection layer and a first adhesion layer, the second encapsulation layer comprises a second protection layer and a second adhesion layer, the first and second protection layers are formed of poly (p-xylylene), and the first and second adhesion layers are formed of epoxy resin.

10. A quantum dot electronic device comprising:
a substrate; and
a quantum dot pattern disposed on the substrate, wherein the quantum dot pattern is formed by an intaglio transfer printing method that comprises:
   forming a quantum dot layer on a donor substrate;
   picking up the quantum dot layer using a stamp;
   putting the quantum dot layer into contact with an intaglio substrate using the stamp; and
   separating the stamp from the intaglio substrate.

11. The quantum dot electronic device of claim 10, wherein a surface energy of the intaglio substrate is greater than a surface energy of the stamp.

12. The quantum dot electronic device of claim 10, wherein a transfer rate of the quantum dot pattern by the intaglio transfer printing method is about 99% or more in a size of about 5 μm×5 μm or more.

13. The quantum dot electronic device of claim 10, wherein a size of the quantum dot pattern is about 20 μm×20 μm or less.

14. The quantum dot electronic device of claim 10, wherein the quantum dot pattern comprises a red quantum dot pattern, a green quantum dot pattern and a blue quantum dot pattern, and the quantum dot electronic device is a quantum dot light emitting device.

15. The quantum dot electronic device of claim 10, wherein the quantum dot pattern is formed of a colloid nanocrystal substance comprising at least one of CdSe/ZnS quantum dot and CdSe/CdS/ZnS quantum dot.

16. The quantum dot electronic device of claim 10, wherein the substrate is a wearable substrate, a flexible substrate, a stretchable substrate or a plastic substrate.

17. The quantum dot electronic device of claim 1, wherein the quantum dot pattern includes a plurality of patterns, each of the plurality of patterns occupying a portion of a predetermined shape, a size of the portion being equal to or greater than 99% of a size of the predetermined shape.

18. The quantum dot electronic device of claim 17, wherein the size of the predetermined shape is in a range from 5 μm×5 μm to 230 μm×230 μm.

* * * * *